US012628700B2

(12) United States Patent
Kang et al.

(10) Patent No.: US 12,628,700 B2
(45) Date of Patent: May 12, 2026

(54) LED DISPLAY APPARATUS

(71) Applicant: SAMSUNG ELECTRONICS CO., LTD., Suwon-si (KR)

(72) Inventors: Sammook Kang, Suwon-si (KR); Mihyun Kim, Suwon-si (KR); Hankyu Seong, Suwon-si (KR); Jihye Yeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 495 days.

(21) Appl. No.: 18/221,699

(22) Filed: Jul. 13, 2023

(65) Prior Publication Data

US 2024/0021589 A1    Jan. 18, 2024

(30) Foreign Application Priority Data

Jul. 15, 2022    (KR) ........................ 10-2022-0087470
Feb. 1, 2023    (KR) ........................ 10-2023-0013740

(51) Int. Cl.
| | |
|---|---|
| *H01L 25/075* | (2006.01) |
| *H01L 25/16* | (2023.01) |
| *H10H 20/831* | (2025.01) |
| *H10H 20/851* | (2025.01) |
| *H10H 20/857* | (2025.01) |
(Continued)

(52) U.S. Cl.
CPC ........ *H10W 90/00* (2026.01); *H10H 20/8312* (2025.01); *H10H 20/8514* (2025.01); *H10H 20/857* (2025.01); *H10H 29/142* (2025.01)

(58) Field of Classification Search
CPC .............. H01L 25/0753; H01L 25/167; H10H 20/8312; H10H 20/8514; H10H 20/857; H10H 29/142; H10H 20/8515
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |
| RE38,466 | E | 3/2004 | Inoue et al. |
(Continued)

FOREIGN PATENT DOCUMENTS

KR    10-2019-0061227 A    6/2019

OTHER PUBLICATIONS

US 11,302,746 B2, 04/2022, Chae et al. (withdrawn)

*Primary Examiner* — Norman D Richards
*Assistant Examiner* — Ethan Edward Cutler
(74) *Attorney, Agent, or Firm* — Sughrue Mion, PLLC

(57) ABSTRACT
A display apparatus includes a circuit board including a driver circuit, and a pixel array including a plurality of pixels on the circuit board, where each of the plurality of pixels includes a first sub-pixel, a second sub-pixel, and a third sub-pixel, and where the pixel array includes a lower light emitting structure including a first lower light-emitting diode (LED) cell, a second lower LED cell, and a third lower LED cell respectively corresponding to the first sub-pixel, the second sub-pixel, and the third sub-pixel, each of the first lower LED cell, the second lower LED cell, and the third lower LED cell including a first semiconductor laminate configured to emit first light of a first wavelength, and a base insulating layer on lower surfaces of the first lower LED cell, the second lower LED cell, and the third lower LED cell.

25 Claims, 19 Drawing Sheets

(51) Int. Cl.
    *H10H 29/14*         (2025.01)
    *H10W 90/00*        (2026.01)

(56)            References Cited

U.S. PATENT DOCUMENTS

| | | |
|---|---|---|
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 10,475,957 B2 | 11/2019 | Cha et al. |
| 11,004,835 B2 | 5/2021 | Pschenitzka |
| 2019/0140017 A1 | 5/2019 | Chen et al. |
| 2019/0206927 A1 | 7/2019 | Lee et al. |
| 2020/0135704 A1* | 4/2020 | Herner .................. H10D 84/83 |
| 2020/0135706 A1* | 4/2020 | Sa ......................... H01L 25/167 |
| 2020/0194417 A1* | 6/2020 | Yeon ..................... H10H 29/10 |
| 2021/0126045 A1* | 4/2021 | Yeon ................. H10H 20/8312 |
| 2022/0093834 A1* | 3/2022 | Lin ..................... H10H 20/856 |
| 2022/0139999 A1* | 5/2022 | Yeon ................... H10H 20/851 |
| | | 257/89 |
| 2022/0145178 A1 | 5/2022 | Park et al. |

* cited by examiner

LED DISPLAY APPARATUS

CROSS-REFERENCE TO RELATED APPLICATION(S)

This application claims benefit of priority to Korean Patent Application No. 10-2023-0013740 filed on Feb. 1, 2023, and Korean Patent Application No. 10-2022-0087470 filed on Jul. 15, 2022 in the Korean Intellectual Property Office, the disclosures of which are incorporated herein by reference in their entireties.

BACKGROUND

1. Field

Example embodiments of the present disclosure relate to a light-emitting diode (LED) display apparatus.

2. Description of Related Art

A semiconductor light emitting diode (LED) may be used as a light source for lighting devices and also various electronic products. Also, an LED may be widely used as a light source for various display devices such as a television (TV), a mobile phone, a personal computer (PC), a notebook PC, a personal digital assistant (PDA), etc.

A general display device may mainly include a display panel including a liquid crystal display (LCD) and a backlight, but recently, an LED display panel using LED elements (e.g., micro LEDs) as a light source of a pixel (sub-pixel) has been developed. Such a display device may have a compact size, and may also implement a high-brightness display device having excellent light efficiency as compared to a LCD.

Information disclosed in this Background section has already been known to or derived by the inventors before or during the process of achieving the embodiments of the present application, or is technical information acquired in the process of achieving the embodiments. Therefore, it may contain information that does not form the prior art that is already known to the public.

SUMMARY

Provided is a light-emitting diode (LED) display apparatus having high efficiency which may be formed by a simplified alignment process.

Additional aspects will be set forth in part in the description which follows and, in part, will be apparent from the description, or may be learned by practice of the presented embodiments.

According to an aspect of an example embodiment, a display apparatus may include a circuit board including a driver circuit, and a pixel array including a plurality of pixels on the circuit board, where each of the plurality of pixels may include a first sub-pixel, a second sub-pixel, and a third sub-pixel, where the pixel array may include a lower light emitting structure including a first lower light-emitting diode (LED) cell, a second lower LED cell, and a third lower LED cell respectively corresponding to the first sub-pixel, the second sub-pixel, and the third sub-pixel, each of the first lower LED cell, the second lower LED cell, and the third lower LED cell including a first semiconductor laminate configured to emit first light of a first wavelength, and a base insulating layer on lower surfaces of the first lower LED cell, the second lower LED cell, and the third lower LED cell and including an inter-cell insulating portion extending to a region between the first lower LED cell, the second lower LED cell, and the third lower LED cell, an upper light emitting structure on the lower light emitting structure, the upper light emitting structure including a transparent insulating portion on the first lower LED cell, an upper LED cell on the second lower LED cell and including a second semiconductor laminate configured to emit second light of a second wavelength, a wavelength converter on the third lower LED cell and configured to convert the first light into third light of a third wavelength, and a light blocking partition disposed among the transparent insulating portion, the upper LED cell, and the wavelength converter, the light blocking partition optically isolating the transparent insulating portion, the upper LED cell, and the wavelength converter from each other, a first bonding structure including a first bonding insulating layer on an upper surface of the lower light emitting structure and a first bonding electrode at least partially surrounded by the first bonding insulating layer and connected to each of the first lower LED cell, the second lower LED cell, and the third lower LED cell, and a second bonding structure including a second bonding insulating layer on a lower surface of the upper light emitting structure and bonded to the first bonding insulating layer, and a second bonding electrode at least partially surrounded by the first bonding insulating layer, connected to at least the upper LED cell, and bonded to the first bonding electrode.

According to an aspect of an example embodiment, a display apparatus may include a circuit board including a driver circuit and a pixel array on the circuit board and including a plurality of pixels, where each of the plurality of pixels may include a first sub-pixel, a second sub-pixel, and a third sub-pixel, where the pixel array may further include a lower light emitting structure including a first lower LED cell, a second lower LED cell, and a third lower LED cell respectively corresponding to the first sub-pixel, the second sub-pixel, and the third sub-pixel and configured to emit blue light, an upper light emitting structure including a transparent insulating portion on the first lower LED cell, an upper LED cell on the second lower LED cell and configured to emit green light, and a wavelength converter on the third lower LED cell and configured to convert blue light into red light, a first bonding structure including a first bonding insulating layer on an upper surface of the lower light emitting structure and a first bonding electrode at least partially surrounded by the first bonding insulating layer and connected to each of the first lower LED cell, the second lower LED cell, and the third lower LED cell, and a bonding structure including a second bonding insulating layer on a lower surface of the upper light emitting structure and bonded to the first bonding insulating layer, and a second bonding electrode at least partially surrounded by the second bonding insulating layer, connected to the upper LED cell, and bonded to the first bonding electrode.

According to an aspect of an example embodiment, a display apparatus may include a circuit board including a driver circuit and a pixel array including a plurality of pixels on an upper surface of the circuit board, each of the plurality of pixels including a first sub-pixel, a second sub-pixel, and a third sub-pixel, where the pixel array may further include a lower light emitting structure including a first lower LED cell, a second lower LED cell, and a third lower LED cell each including a first semiconductor laminate configured to emit blue light, an upper light emitting structure on the lower light emitting structure, the upper light emitting structure including a transparent insulating portion on the first lower LED cell, an upper LED cell on the second lower LED cell and including a second semiconductor laminate configured to generate green light, and a wavelength converter on the third lower LED cell and configured to convert blue light into red light, a first bonding structure including a first bonding insulating layer on an upper surface of the lower light emitting structure, and a first bonding electrode on the first bonding insulating layer and connected to each of the first lower LED cell, the second lower LED cell, and the third lower LED cell, and a second bonding structure on a lower surface of the upper light emitting structure, the second bonding structure including a second bonding insulating layer bonded to the first bonding insulating layer and a second bonding electrode on the second bonding insulating layer, connected to the upper LED cell, and bonded to the first bonding electrode, where the first sub-pixel is configured to emit blue light generated by the first lower LED cell from the transparent insulating portion, the second sub-pixel is configured to emit green light generated by the upper LED cell, the second lower LED cell being provided as an inactive cell which is not driven, and the third sub-pixel is configured to convert at least a portion of blue light generated by the third lower LED cell into red light through the wavelength converter and emit red light.

BRIEF DESCRIPTION OF DRAWINGS

The above and other aspects, features, and advantages of certain example embodiments of the present disclosure will be more apparent from the following description taken in conjunction with the accompanying drawings, in which.

DETAILED DESCRIPTION

Figure 1:
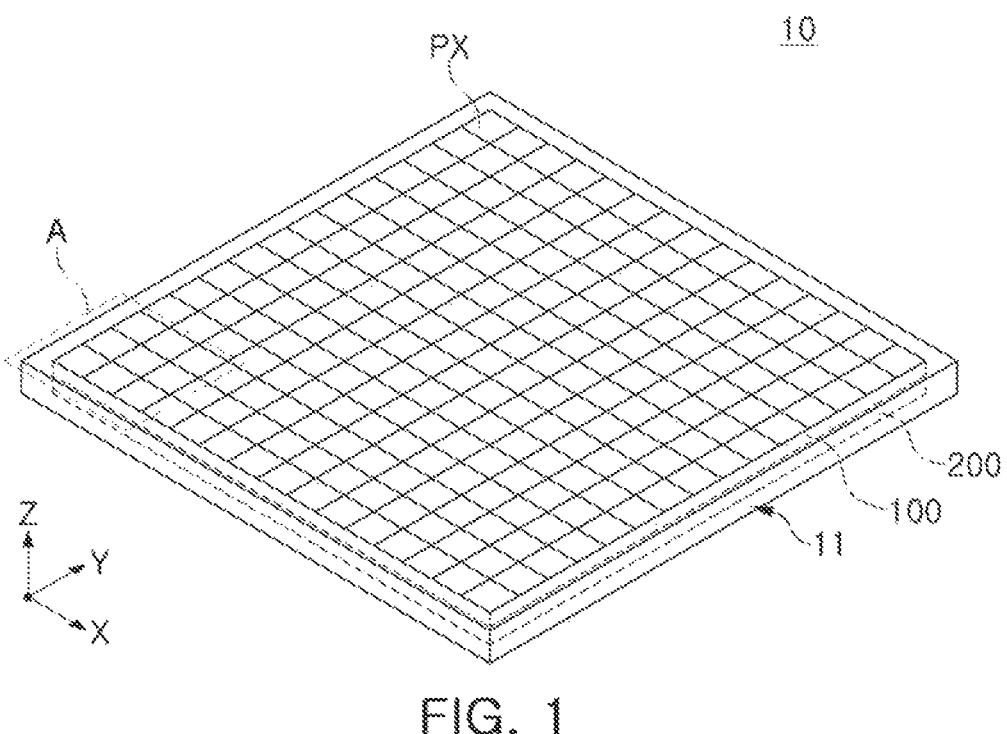
FIG. 1 is a view illustrating a light-emitting diode (LED) display apparatus according to an example embodiment of the present disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms.

Figure 2:
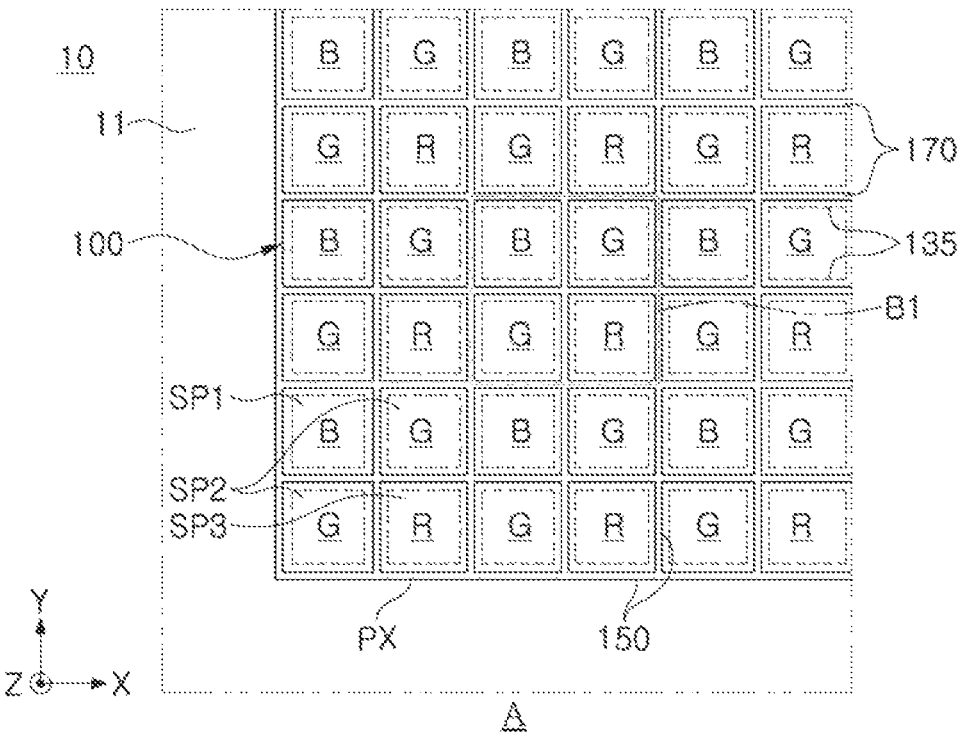
FIG. 2 is an enlarged plan view illustrating portion "A1" in FIG. 1 according to an example embodiment.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c FIG. 1 is a perspective view illustrating a light-emitting diode (LED) display apparatus according to an example embodiment. FIG. 2 is an enlarged plan view illustrating portion "A1" in FIG. 1 according to an example embodiment.

Referring to FIGS. 1 and 2, the display apparatus 10 (also referred to herein as a display panel) according to the example embodiment may include a circuit board 200 including a driver circuit, and a pixel array 100 (also referred to as "LED module for display or variants thereof) disposed on the circuit board 200 and having a plurality of pixels PX arranged thereon. Also, the display apparatus 10 may further include a frame 11 surrounding the circuit board 200 and the pixel array 100.

The plurality of pixels PX in the example embodiment may include first to third sub-pixels SP1, SP2, and SP3 configured to emit light of a specific wavelength (e.g., color) to provide a color image. For example, the first to third sub-pixels SP1, SP2, and SP3 may be configured to emit blue light, green light, and green light, respectively. In each pixel, the first to third sub-pixels SP1, SP2, and SP3 may be disposed in a Bayer pattern. Specifically, each of the plurality of pixels PX may include first and third sub-pixels SP1 and SP3 disposed in a first diagonal direction, and two sub-pixel SP2 disposed in a second diagonal direction intersecting the first diagonal direction. In the example embodiment, in the pixel PX, the first to third sub-pixels SP1, SP2, and SP3 may be disposed in a 2×2 Bayer pattern, but an example embodiment thereof is not limited thereto. In other example embodiments, each pixel PX may be configured in a different arrangement of 1×3, 3×3, or 4×4, and a portion of sub-pixels may be configured to emit light of a different color (e.g., yellow) from the exemplified colors R, G, and B.

As illustrated in FIG. 1, the pixel array in the example embodiment may be disposed in a 15×15 array, but the number of rows and columns may be implemented in any suitable number (e.g., 1,024×768). Depending on desired resolution, the pixel array may have different arrangements.

The frame 11 may be provided as a guide disposed around the pixel array 100 and defining an arrangement space of an array of pixels PX. The frame 11 may include, for example, at least one of polymer, ceramic, semiconductor, or metal. In a specific example, the frame 11 may include a black matrix. The frame 11 is not limited to a black matrix, and a white matrix or a structure of another color may be used depending on the purpose of a product. For example, the white matrix may include a reflective material or a scattering material.

The display apparatus 10 in the example embodiment may have a rectangular planar structure, or may have a structure of another shape. In example embodiments, circuit board 200 may be implemented as a driver circuit board including thin film transistor (TFT) cells. In example embodiments, the circuit board 200 may include only a portion of a driver circuit for a display apparatus and may include another driving device. In example embodiments, the circuit board 200 may be formed using a flexible substrate, thereby implementing a display apparatus having a curved profile.

Figure 3:
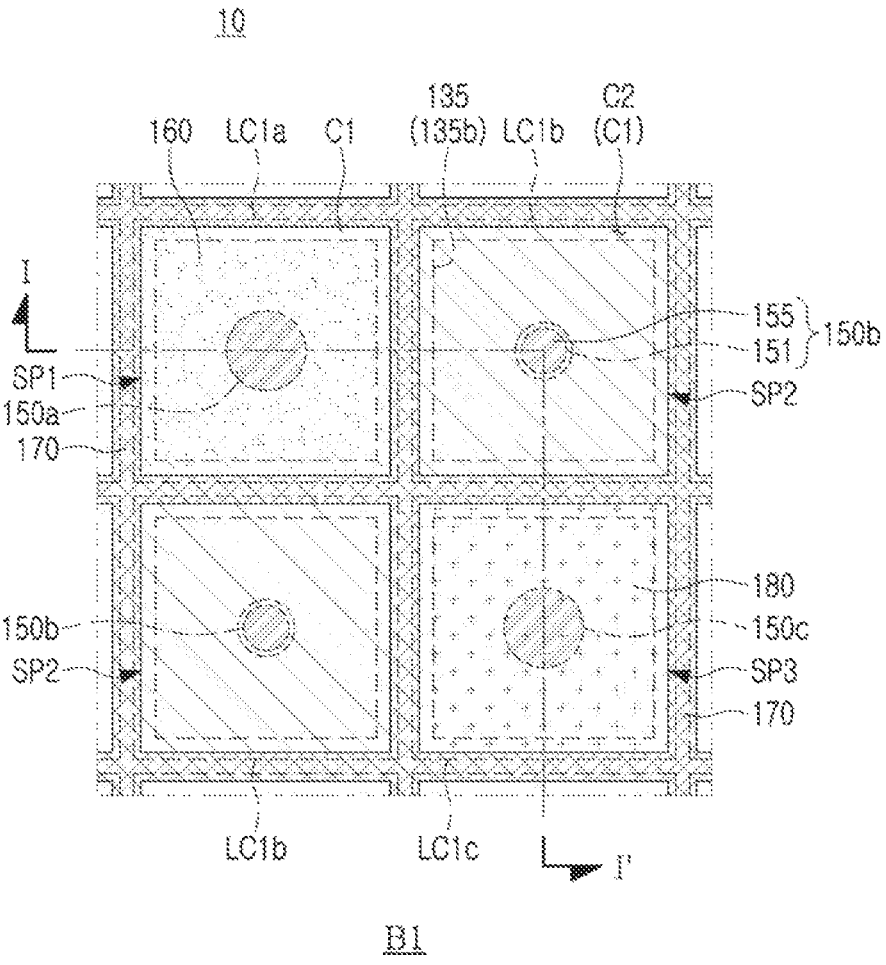
FIG. 3 is a diagram illustrating a pixel unit according to an example embodiment.

A specific configuration of a display apparatus according to the example embodiment will be described with reference to FIGS. 3 and 4. FIG. 3 illustrates a structure of a pixel of the display apparatus illustrated in FIGS. 1 and 2 according to an example embodiment, and FIG. 4 is a cross-sectional view taken along line I-I' in FIG. 3, viewed from side.

Figure 4:
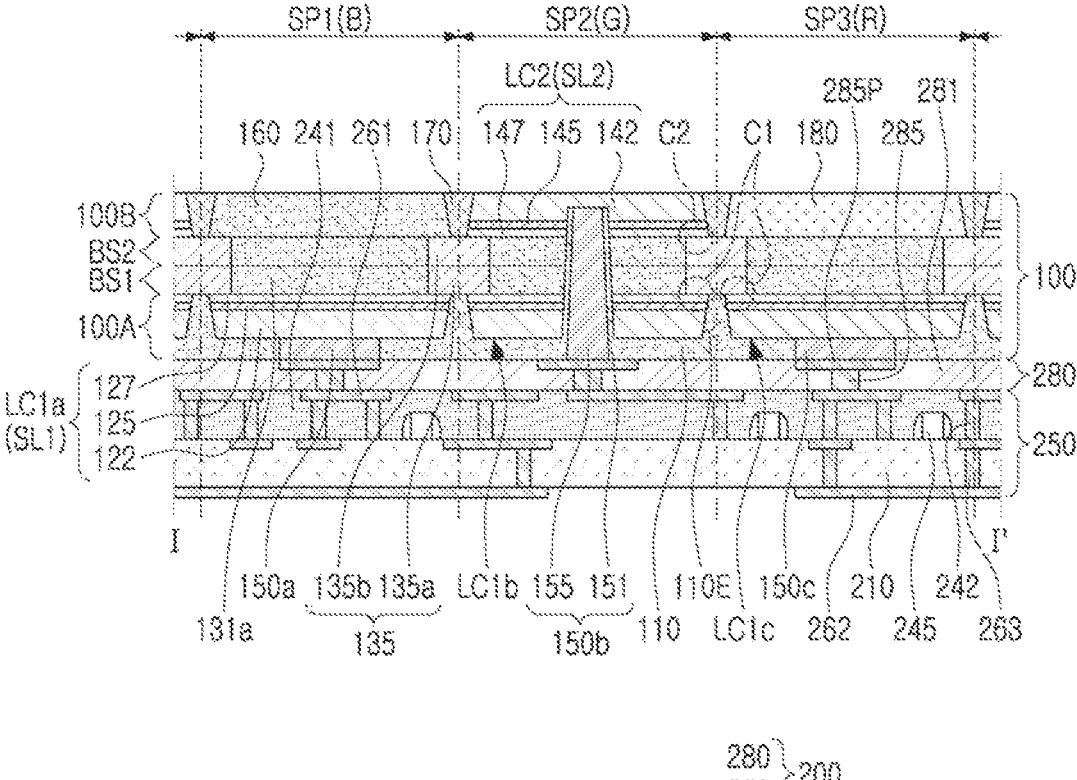
FIG. 4 is a cross-sectional view taken along line I-I' in FIG. 3, viewed from side according to an example embodiment.

Referring to FIGS. 3 and 4, the display apparatus 10 according to the example embodiment may include a circuit board 200 and a pixel array 100 disposed on the circuit board 200.

The pixel array 100 may include a lower light emitting structure 100A having first to third lower LED cells LC1a, LC1b, and LC1c. The pixel array 100 may include an upper light emitting structure 100B including a transparent insulating portion 160 on the first lower LED cell LC1a, an upper LED cell LC2 on the second lower LED cell LC1b, and a wavelength converter 180 on the third lower LED cell LC1c. The pixel array 100 may include a first bonding structure BS1 disposed on the upper surface of the lower light emitting structure 100A and a second bonding structure BS2 disposed on the lower surface of the upper light emitting structure 100B. The lower light emitting structure 100A and the upper light emitting structure 100B may form a pixel array 100 through bonding of the first bonding structure BS1 and the second bonding structure BS2.

In the lower light emitting structure 100A, the first to third lower LED cells LC1a, LC1b, and LC1c may be disposed in regions corresponding to the first to third sub-pixels SP1, SP2, and SP3, respectively, and may include first semiconductor laminates SL1 each configured to emit light of a first wavelength (e.g., blue light). The first to third lower LED cells LC1a, LC1b, and LC may be obtained by dividing the first semiconductor laminate SL1 (see FIG. 9A).

The first semiconductor laminate SL1 may include a first conductive semiconductor layer 122, an active layer 125 and a second conductive semiconductor layer 127. In example embodiments, the first semiconductor laminate SL1 may include a nitride semiconductor. For example, the first conductive semiconductor layer 122 may include a nitride semiconductor satisfying n-type $In_xAl_yGa_{1-x-y}N$ ($0 \leq x < 1$, $0 \leq 1$, $0 \leq x+y < 1$), and n-type impurities may include Si, Ge, Se or Te. The active layer 125 may have a multiple quantum well (MQW) structure in which quantum well layers and quantum barrier layers are alternately stacked. For example, the quantum well layer and the quantum barrier layer may be $In_xAl_yGa_{1-x-y}N$ ($0 \leq x \leq 1$, $0 \leq y \leq 1$, $0 \leq x+y \leq 1$) having different compositions. In a specific example, the quantum well layer may be $In_xGa_{1-x}N$ ($0 < x \leq 1$), and the quantum barrier layer may be GaN or AlGaN. For example, as described above, the active layer 125 may be configured to emit blue light (e.g., 435 nm-460 nm). The second conductive semiconductor layer 127 may include a nitride semiconductor layer satisfying p-type $In_xAl_yGa_{1-x-y}N$ ($0 \leq x < 1$, $0 \leq y < 1$, $0 \leq x+y < 1$), where p-type impurities may include Mg, Zn or Be.

The lower light emitting structure 100A may further include a base insulating layer 110 disposed on lower surfaces of the first to third lower LED cells LC1a, LC1b, and LC1c. The base insulating layer 110 may have an inter-cell insulating portion 110E extending to a region between the first to third lower LED cells LC1a, LC1b, and LC1c. As such, the first to third lower LED cells LC1a, LC1b, and LC1c may be isolated from each other by the inter-cell insulating portion 110E.

In example embodiments, the base insulating layer 110 may include a light reflective structure. For example, before the base insulating layer 110 is formed, an insulating film may be conformally formed on the lower surface and side surfaces of the first to third lower LED cells LC1a, LC1b, and LC1c, a reflective metal film may be formed on the insulating film, and a base insulating layer 110 for filling may be formed on the reflective metal film. In another example embodiment, the base insulating layer 110 may include a black matrix or a white matrix, or may include a dielectric distributed Bragg reflector (DBR) layer and a filling insulating material. For example, the dielectric DBR layer may be obtained by alternately stacking first and second dielectric layers having different refractive indices.

In the upper light emitting structure 100B, the transparent insulating portion 160, the upper LED cell LC2 and the wavelength converter 180 may be disposed in regions corresponding to the first to third sub-pixels SP1, SP2, and SP3, respectively.

The transparent insulating portion 160 disposed in the first sub-pixel SP1 may include an insulating material having light transmissivity. For example, the transparent insulating portion 160 may include a transparent resin such as a silicone resin or an epoxy resin, or a silicon oxide such as $SiO_2$. The transparent insulating portion 160 may form an upper region of the first sub-pixel SP1 and may have a shape corresponding to that of the first lower LED cell LC1a in a plan view. As such, the first sub-pixel SP1 may be configured such that light (e.g., blue light) of the first wavelength generated by the first lower LED cell LC1a may be emitted as is through the transparent insulating portion 160.

The upper LED cell LC2 disposed in the second sub-pixel SP2 may have a second semiconductor laminate SL2 configured to emit light (e.g., green light) of a second wavelength. Similar to the first semiconductor laminate SL1, the second semiconductor laminate SL2 may include a first conductive semiconductor layer 142, an active layer 145 and a second conductive semiconductor layer 147. In example embodiments, the second semiconductor laminate SL2 may include a nitride semiconductor. For example, the first conductive semiconductor layer 142 may include a nitride semiconductor satisfying n-type $In_xAl_yGa_{1-x-y}N$ ($0 \leq x < 1$, $0 \leq 1$, $0 \leq x+y < 1$), where n-type impurities may include Si, Ge, Se or Te. The active layer 145 may have a MQW structure in which quantum well layers and quantum barrier layers are alternately stacked. For example, the quantum well layer and the quantum bather barrier layer may be $In_xAl_y$ $Ga_{1-x-y}N$ ($0 \leq x \leq 1$, $0 \leq y \leq 1$, $0 \leq x+y \leq 1$) having different compositions. In a specific example, the quantum well layer may be $In_xGa_{1-x}N$ ($0 < x \leq 1$), and the quantum barrier layer may be GaN or AlGaN. For example, as described above, the active layer 145 may be configured to emit green light (e.g., 480 nm-530 nm). The second conductive semiconductor layer 147 may include a nitride semiconductor layer satisfying p-type $In_xAl_yGa_{1-x-y}N$ ($0 \leq x < 1$, $0 \leq y < 1$, $0 \leq x+y < 1$), where p type impurities may include Mg, Zn or Be.

The second sub-pixel SP2 in the example embodiment may be configured to emit light (e.g., green light) of a second wavelength generated by the upper LED cell LC2. The second lower LED cell LC1b disposed below the upper LED cell LC2 may be provided as an inactive cell not emitting light because the cell LC1b is not driven.

The wavelength converter 180 disposed in the third sub-pixel SP3 may include a wavelength conversion material (e.g., phosphors or quantum dots) converting light (e.g., blue light) of the first wavelength into light (e.g., red light) of the third wavelength. For example, the wavelength converter 180 may include a transparent resin or phosphor film containing a wavelength conversion material. The transparent resin may include, for example, a silicone resin or an epoxy resin. The wavelength converter 180 may form an upper region of the third sub-pixel SP3 and may have a shape corresponding to that of the third lower LED cell LC1c in a plan view. As such, the third sub-pixel SP3 may convert at least a portion of light (e.g., blue light) of the first wavelength generated by the third lower LED cell LC1c to light of a second wavelength (e.g., red light) through the wavelength converter 180 and may emit the light.

The upper light emitting structure 100B may further include a light blocking partition 170 disposed between transparent insulating portion 160, the upper LED cell LC2, and the wavelength converter 180. The light blocking partition 170 may be included as a structure for preventing light interference between the first to third sub-pixels SP1, SP2, and SP3 in the upper light emitting structure 100B.

The light blocking partition 170 may include an insulating material for blocking light. In example embodiments, as the light blocking partition 170, a material such as a black matrix or a white matrix, or a structure of another color may be used. For example, the white matrix may include a reflective material or a scattering material. In example embodiments, the light blocking partition 170 may include a DBR layer.

In the example embodiment, the lower light emitting structure 100A and the upper light emitting structure 100B may be bonded by bonding by first and second bonding structures BS1 and BS2.

The first bonding structure BS1 may include a first bonding insulating layer 131a disposed on the upper surface of the lower light emitting structure 100A and a first bonding electrode surrounded by the first bonding insulating layer 131a. The first bonding electrode 135a may be configured to be electrically connected to each of the first to third lower LED cells LC1a, LC1b, and LC1c. In the example embodiment, the first bonding electrode 135a may be connected to the corner regions C2 of adjacent lower LED cells along the boundary of the first to third lower LED cells LC1a, LC1b, and LC1c on the upper surface of the lower light emitting structure 100A. For example, the first bonding electrode 135a may have a grid shape in a plan view (see FIGS. 2 and 3).

The second bonding structure BS2 may include a second bonding insulating layer 131b disposed on the lower surface of the upper light emitting structure 100B and a second bonding electrode 135b surrounded by the second bonding insulating layer 131b. The second bonding electrode 135b may be electrically connected to each of the upper LED cells LC2. In the example embodiment, the second bonding electrode 135b may have a shape corresponding to that of the first bonding electrode 135a in a plan view. The first and second bonding electrodes 135a and 135b may secure a sufficient bonding area. For example, the second bonding electrode 135b may have a grid shape the same as/similarly to the first bonding electrode 135a in a plan view (see FIGS. 2 and 3). The second bonding electrode 135b may extend along the boundary of the transparent insulating portion 160, the upper LED cells LC2 and the wavelength converter 180 upper LED cells LC2 on the lower surface of the upper light emitting structure, and may be formed to be electrically connected to the corner regions C1 of the upper LED cells LC2.

As described above, the lower light emitting structure 100A and the upper light emitting structure 100B may be combined by bonding of the first and second bonding structures BS1 and BS2 and may form a pixel array 100. To implement strong bonding, the first bonding electrode 135a may have an upper surface substantially coplanar with an upper surface of the first bonding insulating layer 131a. Similarly, the second bonding electrode 135b may have an upper surface substantially coplanar with an upper surface of the second bonding insulating layer 131b.

The directly bonded first bonding electrode 135a and the second bonding electrode 135b may be bonded by mutual diffusion between metals (e.g., copper) through a high-temperature annealing process. The metal included in the first bonding electrode 135a and the second bonding electrode 135b may not be limited to copper (Cu) and may include other metal materials (e.g., Au) which may be bonded under similar conditions. The bonding between the metals may ensure electrical connection together with strong bonding. In the example embodiment, the first and second bonding electrodes 135a and 135b metal-bonded in the first and second bonding structures BS1 and BS2 may also be provided as common electrodes 135 for light sources of the first to third sub-pixels SP1, SP2, and SP3. Specifically, the common electrode 135 may be connected to the first and third lower LED cells LC1a and LC1c of each of the first and third sub-pixels SP1 and SP3 and the upper LED cell LC2 of the second sub-pixel SP2. In the example embodiment, the common electrode 135 may also have a grid shape in a plan view.

The first and second bonding insulating layers 131a and 131b may include a light transmissive dielectric material. Light (e.g., blue light) emitted from the first and third lower LED cells may be transmitted through the first and second bonding insulating layers 131a and 131b, respectively, and may be emitted through the transparent insulating portion 160 (e.g., a transparent resin portion) and the wavelength converter 180. For example, the first and second bonding insulating layers 131a and 131b may include silicon oxide ($SiO_2$). The first and second bonding insulating layers 131a and 131b may include bonding between dielectrics by a covalent bond during a high-temperature bonding process. In example embodiments, the first and second bonding insulating layers 131a and 131b may further include another insulating film such as SiCN, SiON, or SiCO.

The first and second bonding structures BS1 and BS2 may form bonding between dielectrics of the first and second bonding insulating layers 131a and 131b along with bonding between metals of the first and second bonding electrodes 135a and 135b. Such bonding may also be referred to as "hybrid bonding."

The pixel array 100 according to the example embodiment may include first to third individual electrodes 150a, 150b, and 150c as electrodes (first electrodes) on one side of light sources of first to third sub-pixels SP1, SP2, and SP3.

The first individual electrode 150a may be disposed on the lower surface of the first lower LED cell LC1a and may be electrically connected to the first conductive semiconductor layer 122 of the first lower LED cell LC1a. Similarly, the third individual electrode 150c may be disposed on the lower surface of the third lower LED cell LC1c and may be electrically connected to the first conductive semiconductor layer 122 of the third lower LED cell LC1c. The first and third individual electrodes 150a and 150c may be buried in the base insulating layer to expose a contact region. The contact regions of the first and third individual electrodes 150a and 150c may have a surface substantially coplanar with the lower surface of the base insulating layer 110.

The second individual electrode 150b may penetrate through a portion of the second lower LED cell LC1b, the first and second bonding insulating layers 131a and 131b and the upper LED cell LC2 and may be electrically connected to the first conductive semiconductor layer 142 of the upper LED cell LC2. The second individual electrode 150b may include a through via 155 extending from the lower surface of the second lower LED cell LC1b to the second conductive semiconductor layer 147 of the upper LED cell LC2, and a side wall insulating film 151 surrounding the side wall of the through via 155. The side wall insulating film 151 may electrically insulate the second individual electrode 150b from the second lower LED cell LC1b. In the example embodiment, since the second lower LED cell LC1b insulated by the second individual electrode 150b is not connected to one side electrode, the cell may be an inactive LED cell not actually driven.

The pixel array 100 according to the example embodiment may include a common electrode 135 as the other electrode (second electrode) of the light sources of the first to third sub-pixels SP1, SP2, and SP3. As described above, the common electrode 135 may be provided by the bonded first and second bonding electrodes 135a and 135b.

As described above, each of the first and second semiconductor laminates SL1 and SL2 may include a first conductive semiconductor layer 122 and 142, an active layer 125 and 145 and a second conductive semiconductor layer 127 and 147, and the first and second semiconductor laminates SL1 and SL2 may be disposed such that the second conductive semiconductor layers 127 and 147 may oppose each other. Accordingly, the first and second bonding electrodes 135a and 135b may be electrically connected to the second conductive semiconductor layers 127 and 147 of the first and second semiconductor laminates SL1 and SL2, respectively, and the common electrode 135 in the example embodiment may serve as the second electrode.

In the first to third lower LED cells LC1a, LC1b, and LC1c, an ohmic contact layer may be disposed on each of an upper surface of the second conductive semiconductor layer 127 and a lower surface of the first upper LED cell LC2. The first and second bonding electrodes 135a and 135b may be connected to the second conductive semiconductor layers 127 and 147 through an ohmic contact layer, respectively. The ohmic contact layer formed on the lower surfaces of the first to third lower LED cells LC1a, LC1b, and LC1c may include a light transmissive ohmic contact layer. For example, the light transmissive ohmic contact layer may include ITO, ZITO, ZIO, GIO, ZTO, FTO, AZO, GZO, $In_4Sn_3O_{12}$ or $Zn_{(1-x)}Mg_xO(0 \leq x \leq 1)$. In example embodiments, a highly reflective ohmic contact layer such as Ag and/or Ni/Au may be disposed on the upper surface of the upper LED cell LC2.

Also, in the example embodiment, each of the first to third lower LED cells LC1a, LC1b, and LC1c may have a side surface that is inclined such that a width of each of the first to third lower LED cells increases toward the upper light emitting structure 100B, and the upper LED cell may have a side surface that is inclined such that a width of the upper LED cell increases toward the lower light emitting structure 100A. The inclined side surface may be defined in the direction in which the etching process is performed (see FIGS. 9A and 11C).

As described above, in the upper light emitting structure 100B, the first to third sub-pixels SP1, SP2, and SP3 may be optically isolated by the light blocking partition 170. In the example embodiment, the light blocking partition 170 may be disposed to overlap the second bonding electrode 135b (i.e., the common electrode 130) in a direction (Z direction) perpendicular to the upper surface of the circuit board. In the example embodiment, the common electrode 130 having a grid shape may be provided as an optical isolation structure for the first to third sub-pixels SP1, SP2, and SP3 together with the light blocking partition 170. In example embodiments, as described above, the base insulating layer 110 may include a reflective element, such that the common electrode 130 and the light blocking partition 170 together with the inter-cell insulating portion 110E may be provided as an optical isolation structure for the third sub-pixels SP1, SP2, and SP3. In the example embodiment, the light blocking partition 170 may have a cross-sectional shape in which the width of a lower end is smaller than the width of the upper end, but an example embodiment thereof is not limited thereto, and the light blocking partition 170 may be varied according to a process sequence for the upper light emitting structure 100B.

As such, the pixel array 100 according to the example embodiment may use first and third lower LED cells LC1a and LC disposed on the first level and including a first semiconductor laminate SL1 and an upper LED cell LC2 disposed on the second level and including a second semiconductor laminate SL2 as light sources. The pixel array 100 may include a wavelength converter 180 for the third lower LED cell LC1c on the second level, such that light of different colors B, G, and R may be emitted from the first to third sub-pixels SP1, SP2, and SP3. Also, the light sources of each sub-pixels SP1, SP2, and SP3 (i.e., the first lower LED cells LC1a, the upper LED cell LC2 and the third lower LED cell LC1c) together with the common electrode 130 may be selectively driven by applying voltage through the first to third individual electrodes.

The circuit board 200 in the example embodiment may include a wiring connection layer 280 and a device layer 210 in which a driver circuit including a plurality of TFT cells 245 is implemented. The device layer 210 may include a semiconductor substrate 210, a driver circuit including a TFT cell 245 formed on the semiconductor substrate 210, an interconnection portion 242 electrically connected to the TFT cell 245, and an interlayer insulating film 241 disposed on the semiconductor substrate 210 and covering the driver circuit and the interconnection portion 242. For example, the semiconductor substrate 210 may include a semiconductor such as Si or Ge or a compound semiconductor such as SiGe, SiC, GaAs, InAs, or InP.

The wiring connection layer 280 may include a dielectric layer 281 disposed on the interlayer insulating film 241 and a metal wiring 285 disposed on the dielectric layer 281 and connected to the interconnection portion 242. The metal wiring 285 may be electrically connected to the driver circuit through the interconnection portion 242.

The metal wiring 285 may have a bonding pad 285P exposed to the upper surface of the dielectric layer 281. The bonding pad 285P may have a surface substantially coplanar with an upper surface of the dielectric layer 281. The coplanar upper surface of the dielectric layer 281 may be bonded to the coplanar lower surface of the base insulating layer 110, and the bonding pad 285P may be bonded to the first to third individual electrodes 150a, 150b, and 150c. A through via connected to the common electrode 135 on one side of the pixel array 100 may be connected to another bonding pad 285P.

A driver circuit including a plurality of TFT cells 245 implemented on the circuit board 200 may be a driver circuit for controlling driving of a pixel (specifically, a sub-pixel). The semiconductor substrate 210 may include a through electrode 263 such as a through silicon via (TSV) connected to a driver circuit and first and second wiring lines 261 and 262 connected to the through electrode. For example, drain regions of the plurality of TFT cells 245 may be connected to a first wiring line 261 through a through electrode 263, and the first wiring line 261 may be connected to a data line.

Figure 5:
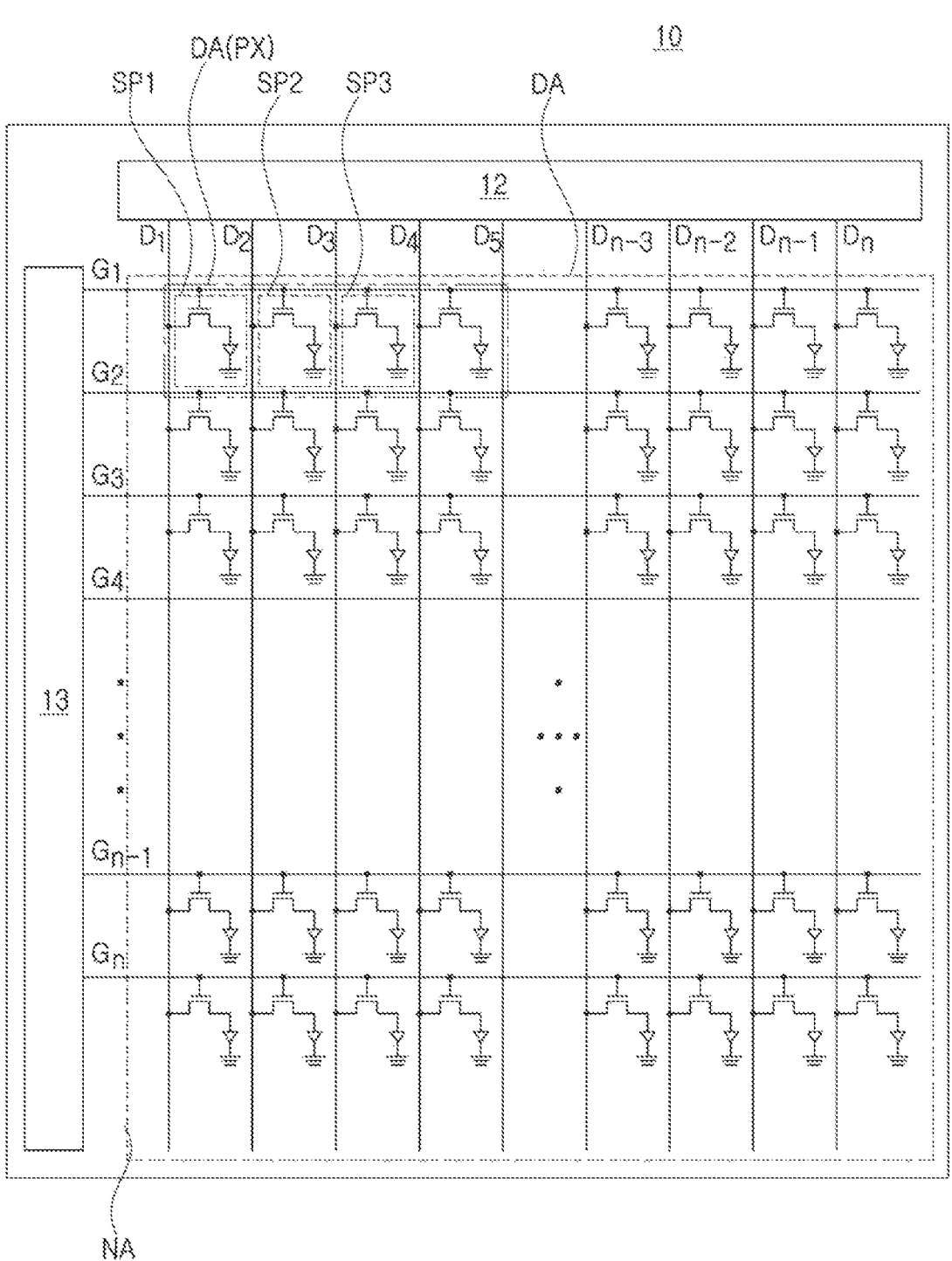
FIG. 5 is illustrates a driving circuit illustrating an LED display apparatus according to an example embodiment of the present disclosure.

FIG. 5 illustrates a driving circuit illustrating an LED display apparatus according to an example embodiment.

In FIG. 5, a circuit diagram of a display panel 10 in which n×n sub-pixels are disposed is illustrated. The first to third sub-pixels SP1, SP2, and SP3 may receive data signals through data lines D1 to Dn, which are vertical (row direction) paths. The first to third sub-pixels SP1, SP2, and SP3 may receive control signals (gate signals) through gate lines G1-Gn which are horizontal (column) paths.

The plurality of pixels PX including the first to third sub-pixels SP1, SP2, and SP3 may provide an active region DA for display, and the active region DA may be provided as a display region for a user. The inactive region NA of the display panel 10 may be formed along one or more edges of the active region DA. The inactive region NA may have no pixels PX along the outer periphery of the display panel 10 and may correspond to the frame 11 of the display panel 10.

The first and second driver circuits 12 and 13 may be employed to control the operation of the pixel PX (i.e., a plurality of sub-pixels SP1, SP2, SP3, and SP4). A portion of or the entirety of the first and second driver circuits 12 and 13 may be implemented on the device layer 250 of the circuit board 200. The first and second driver circuits 12 and 13 may be formed as integrated circuits, thin film transistor panel circuits, or other suitable circuits, and may be disposed in the inactive region NA of the display panel 10. The first and second driver circuits 12 and 13 may include a microprocessor, a memory such as a storage, a processing circuit, and a communication circuit. During operation, the system control circuit may supply image information to be displayed on the display panel 10 to the first and second driver circuits 12 and 13.

To display an image on the pixel PX, the first driver circuit 12 may transmit a clock signal and other control signals to the second driver circuit 13 (also referred to as a gate driver circuit) while supplying image data to the data lines D1-Dn. The second driver circuit 13 may be implemented using an integrated circuit and/or a thin film transistor circuit. A gate signal for controlling the first to third sub-pixels SP1, SP2, and SP3 disposed in a column direction may be transmitted through the gate lines G1-Gn of the display apparatus.

As such, the LED display apparatus 10 according to the example embodiment may have a two-level light source structure having lower LED cells and upper LED cells emitting light of different wavelengths, and may implement a desired pixel by partially including a light conversion structure on the upper level.

FIGS. 6A, 6B, 6C and 6D are cross-sectional views illustrating a portion of processes of a method of manufacturing an LED display apparatus according to an example embodiment of the present disclosure. FIGS. 6A-6D show processes of forming and bonding first and second semiconductor laminates.

Figure 6A:
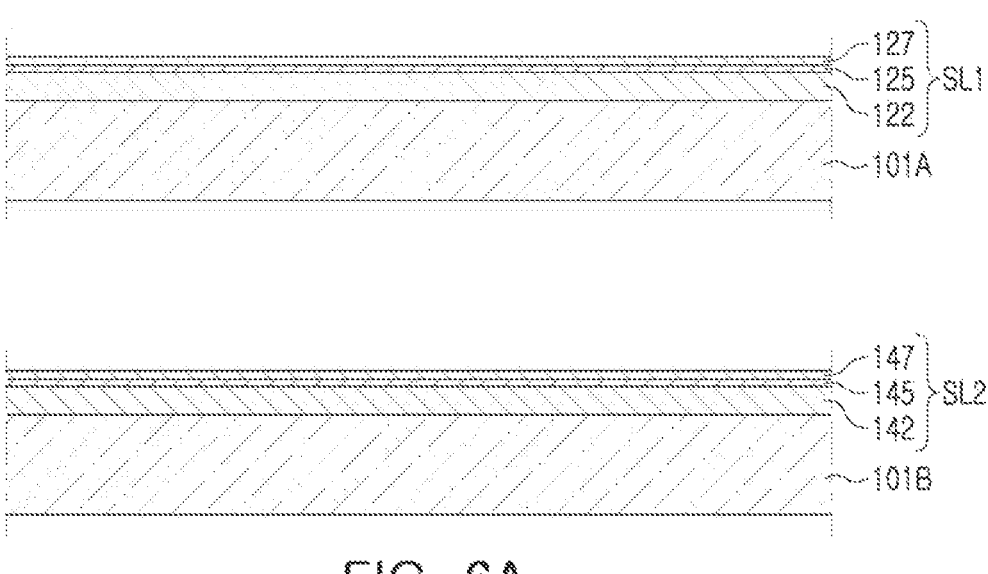
FIGS. 6A, 6B, 6C and 6D are cross-sectional views illustrating a portion of processes of a method of manufacturing an LED display apparatus according to an example embodiment of the present disclosure.

Referring to FIG. 6A, a first semiconductor laminate SL1 may be formed on a first growth substrate 101A, and similarly, a second semiconductor laminate SL2 may be formed on a second growth substrate 101B.

The first and second growth substrates 101A and 101B may include insulating, conductive, or semiconductor materials such as sapphire, Si, SiC, $MgAl_2O_4$, MgO, $LiAlO_2$, $LiGaO_2$, GaN, and the like. The first semiconductor laminate SL1 may include a first conductive semiconductor layer 122 formed in order on a first growth substrate 101A, an active layer 125 generating light of a first wavelength, and a second conductive semiconductor layer 127. The second semiconductor laminate SL2 may include a first conductive semiconductor layer 142 formed in order on the second growth substrate 101B, an active layer 145 generating light of a second wavelength, and a second conductive semiconductor layer 147. Light of the first wavelength and light of the second wavelength may be for the first and third sub-pixels, for example, blue light and green light, respectively.

As described above, each layer of the first and second semiconductor laminates SL1 and SL2 may be a nitride semiconductor layer, and may be grown using processes such as metal organic chemical vapor deposition (MOCVD), hydride vapor phase epitaxy (HVPE), and molecular beam epitaxy (MBE). Before forming the first and second semiconductor laminates SL1 and SL2, a buffer layer and an undoped semiconductor layer (e.g., undoped GaN) may be additionally formed on the upper surfaces of the first and second growth substrates 101A and 101B. In example embodiments, an ohmic contact layer may be formed on the second conductive semiconductor layers 127 and 147 as described above.

Figure 6B:
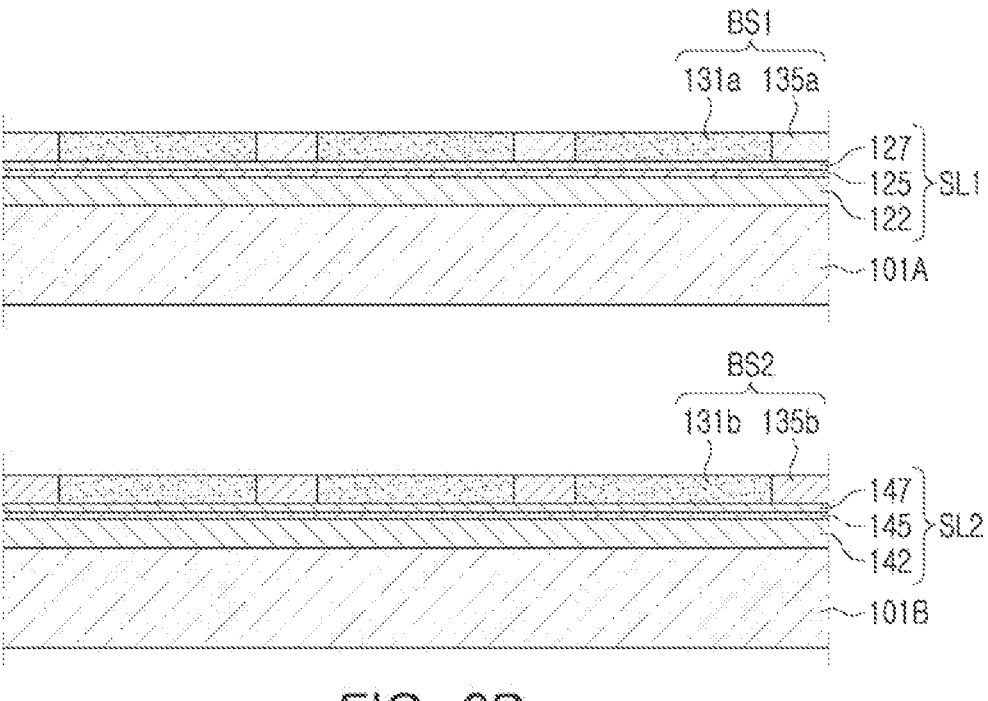

Thereafter, referring to FIG. 6B, a first bonding structure BS1 having a first bonding electrode 135a and a first bonding insulating layer 131a may be formed on the first semiconductor laminate SL1, and similarly, a second bonding structure BS2 including a second bonding electrode 135b and a second bonding insulating layer 131b may be formed on the second semiconductor laminate SL2.

The forming the first and second bonding structures BS1 and BS2 may include processes of forming first and second bonding insulating layers 131a and 131b on the first and second semiconductor laminates SL1 and SL2, respectively, forming first and second openings defining first and second bonding electrodes 135a and 135b in first and second bonding insulating layers 131a and 131b, and depositing a metal such that the first and second openings are filled and planarizing. For example, the first and second bonding electrodes 135a and 135b may include copper (Cu), but an example embodiment thereof is not limited thereto, and may include other bondable metal materials (e.g., Au). Also, the first and second bonding insulating layers 131a and 131b may include the same dielectric material, for example, silicon oxide (SiO$_2$).

The first and second openings may be formed along a boundary region between the first and second sub-pixel regions. The width of the first and second openings, that is, the first and second bonding electrodes 135a and 135b may have a width greater than a width for dividing the first semiconductor laminate SL1. Specifically, the first and second openings for the first and second bonding electrodes 135a and 135b may be defined to overlap each corner region of the first to third lower LED cells and the corner region of the upper LED cell in subsequent processes. The first and second bonding electrodes may have shapes corresponding to each other in corresponding positions.

Figure 7:
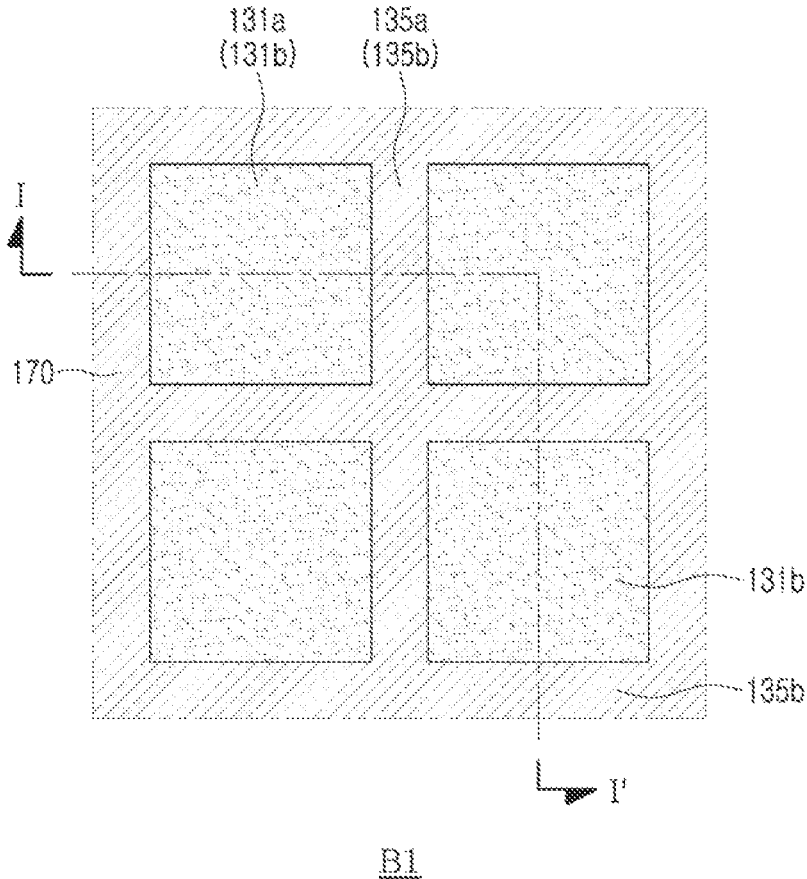
FIG. 7 is a plan view of the first and second bonding structures shown in FIG. 6B according to an example embodiment.

FIG. 7 is a plan view of the first and second bonding structures shown in FIG. 6B. As illustrated in FIG. 7, the first and second bonding electrodes 135a and 135b may have a grid shape dividing sub-pixels.

By the planarization process, the first bonding electrode 135a may have an upper surface substantially coplanar with an upper surface of the first bonding insulating layer 131a. Similarly, the second bonding electrode 135b may have an upper surface substantially coplanar with an upper surface of the second bonding insulating layer 131b.

Figure 6C:
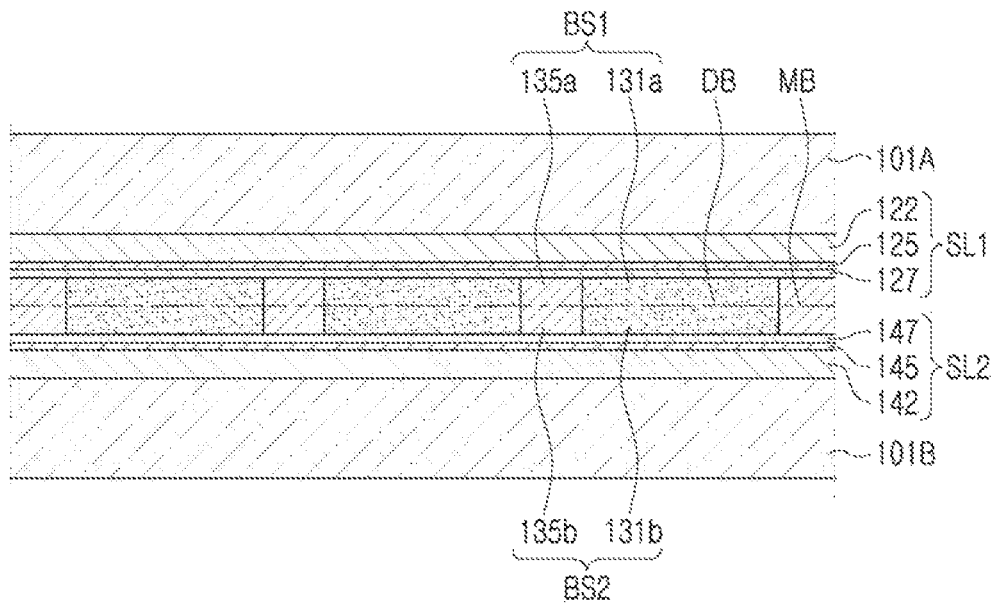
Figure 8:
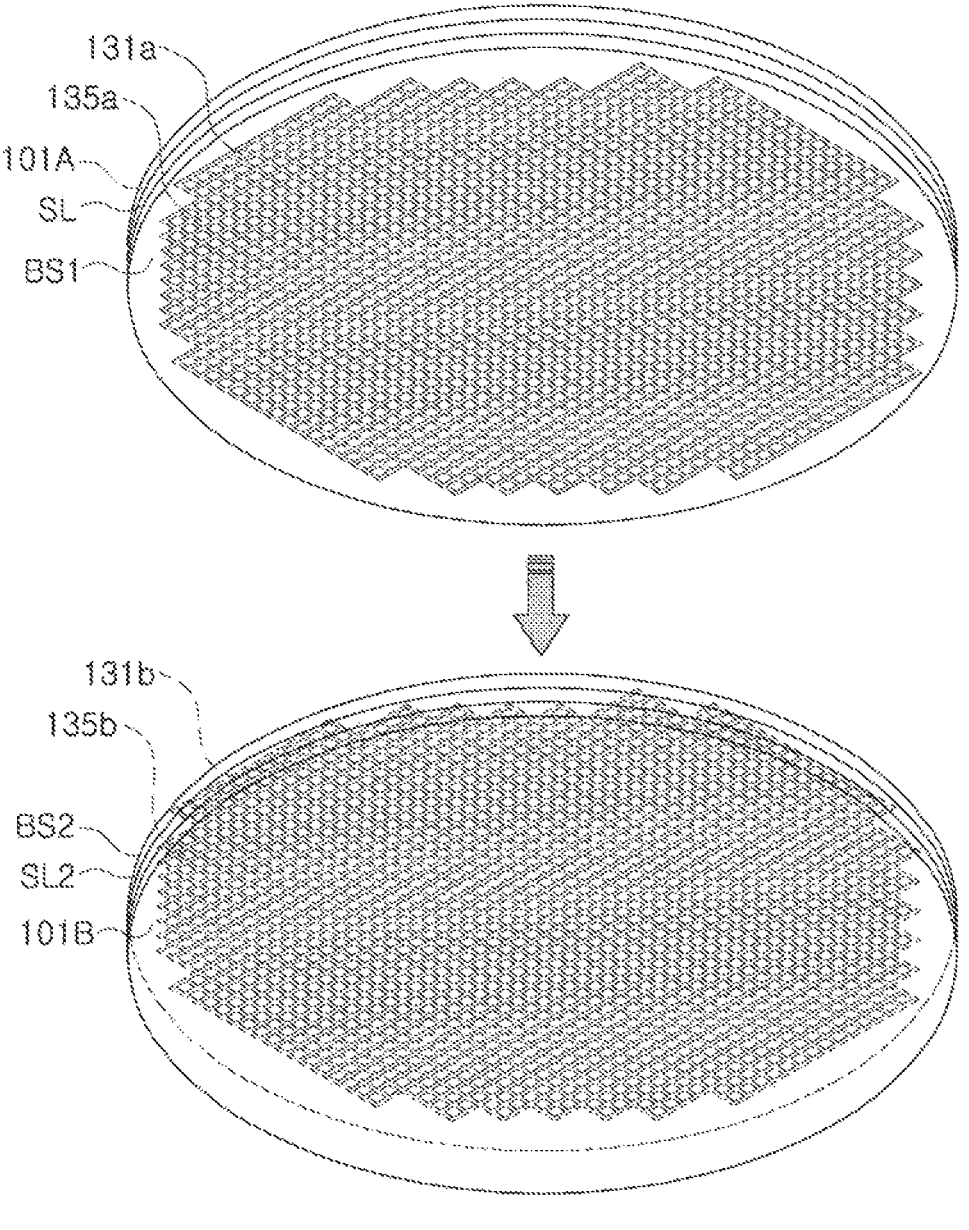
FIG. 8 is a perspective view of a bonding process illustrated in FIG. 6C according to an example embodiment.

Thereafter, referring to FIGS. 6C and 8, the first semiconductor laminate SL1 and the second semiconductor laminate BS2 may be coupled to each other using the first and second bonding structures BS1 and BS2.

In a state in which the first and second bonding structures BS1 and BS2 are bonded, the first and second bonding structures BS1 and BS2 may be hybrid-bonded through a high-temperature annealing process.

Figure 6D:
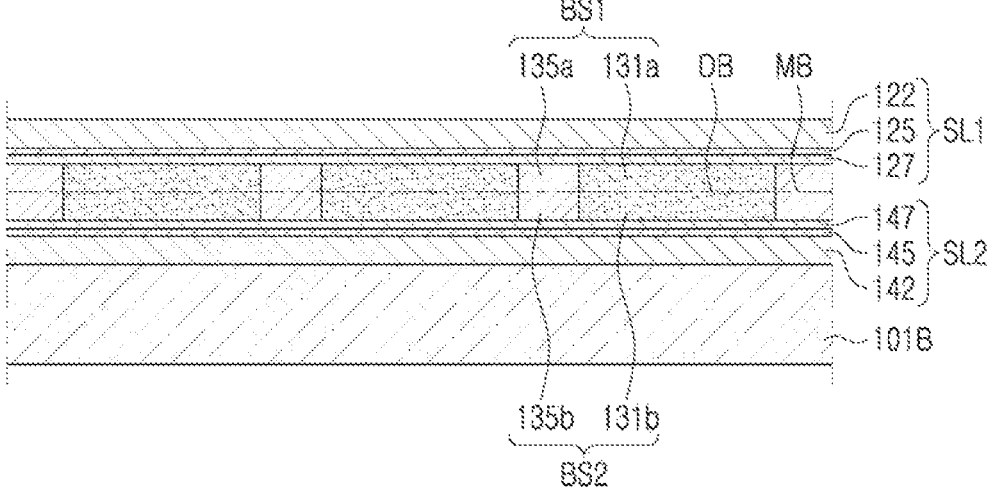

FIG. 8 is a perspective view of a bonding process for allowing the first and second bonding structures shown in FIG. 6C on a wafer level according to an example embodiment. The hybrid bonding implemented in this process may include metal-to-metal bonding (MB) of the first and second bonding electrodes 135a and 135b and dielectric bonding (DB) of the first and second bonding insulating layers 131a and 131b, and the first semiconductor laminate SL1 on the first growth substrate 101A and the second semiconductor laminate SL2 on the second growth substrate 101B may be firmly coupled to each other. Also, the first and second bonding electrodes 135a and 135b may be provided as an integrated common electrode 135 through metal-to-metal bonding (MB). Thereafter, as illustrated in FIG. 6D, the first growth substrate 101A may be removed from the first semiconductor laminate SL1.

Figure 9A:
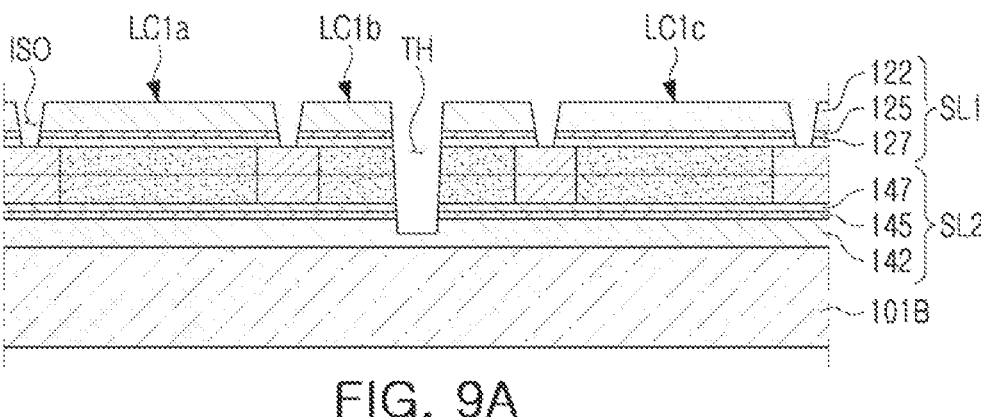
FIGS. 9A, 9B and 9C are cross-sectional views illustrating a portion of processes (processes of forming a lower light emitting structure and an electrode) of a method of manufacturing an LED display apparatus according to an example embodiment of the present disclosure.
Figure 9B:
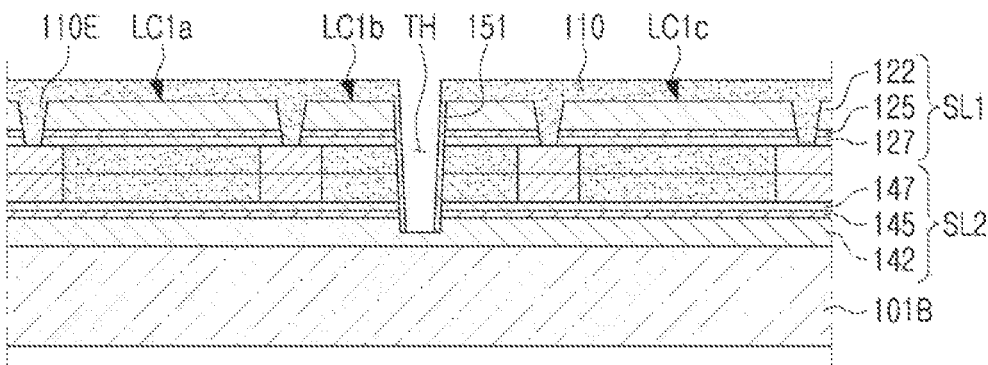
Figure 9C:
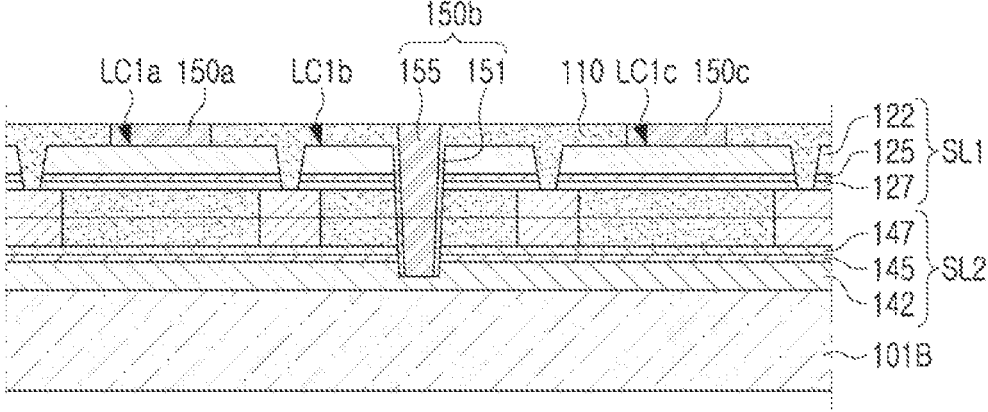

FIGS. 9A, 9B and 9C are cross-sectional views illustrating a portion of processes (processes of forming a lower light emitting structure and an electrode) in a method of manufacturing an LED display apparatus according to an example embodiment. FIGS. 10B and 10C are plan views illustrating results of the processes of FIGS. 9A, 9B and 9C according to an example embodiment.

Figure 10A:
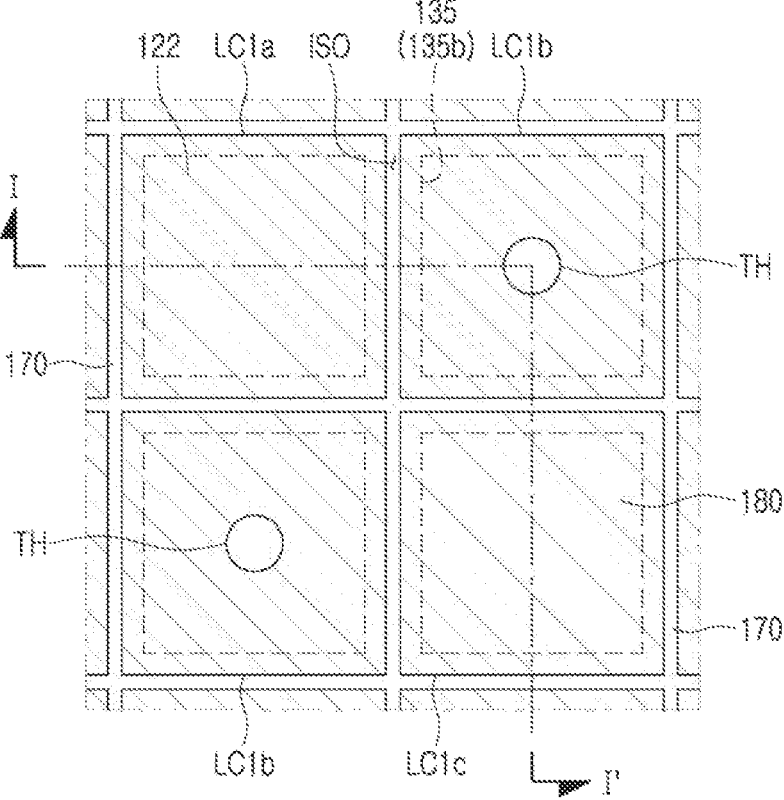
FIGS. 10A, 10B and 10C are plan views illustrating results of the processes of FIGS. 9A, 9B and 9C, respectively, according to an example embodiment.
Figure 10B:
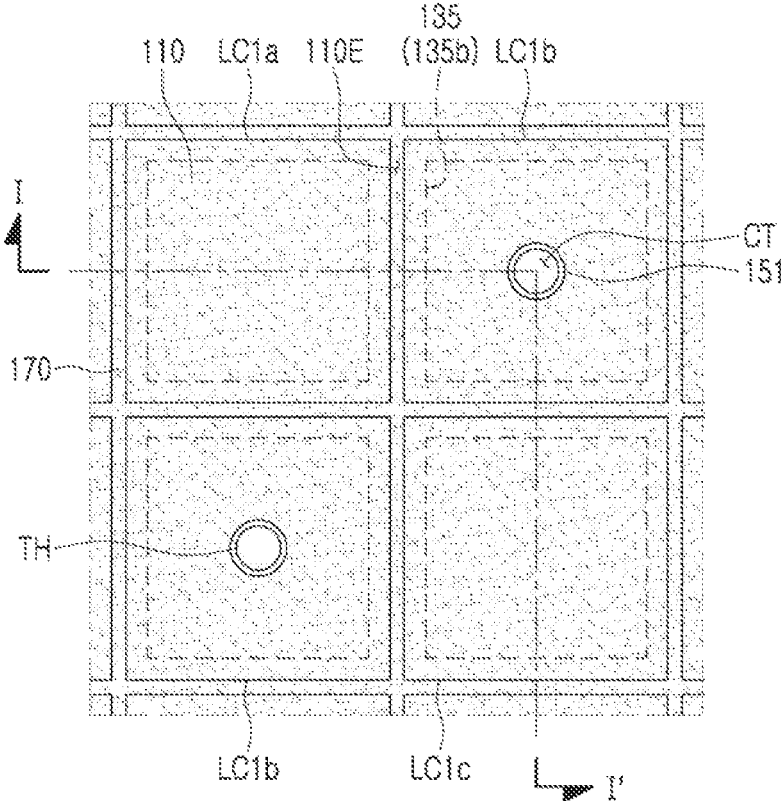
Figure 10C:
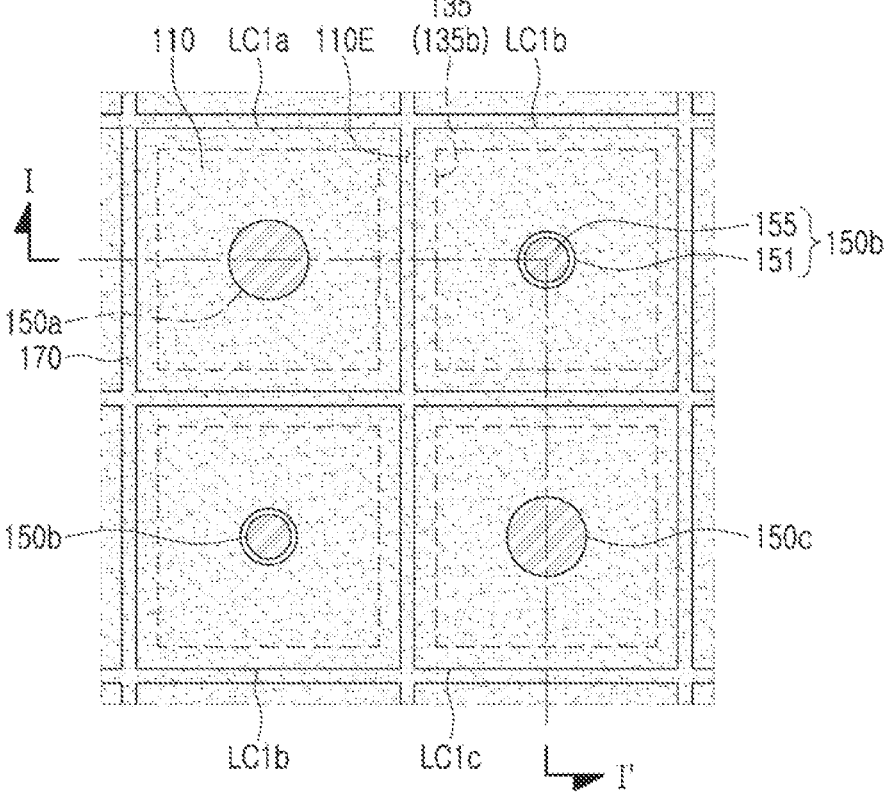

Referring to FIGS. 9A and 10A, a first etching process of dividing the first semiconductor laminate SL1 into sub-pixel regions and a second etching process of forming a through hole TH in the second lower LED cell LC1b may be performed.

The first to third lower LED cells LC1a, LC1b, and LC1c corresponding to sub-pixel regions, respectively, may be formed by dividing the first semiconductor laminate SL1 through the first etching process. As illustrated in FIG. 10A, each of the first to third lower LED cells LC1a, LC1b, and LC1c may have a rectangular shape in a plan view and may form a Bayer pattern. The first and third lower LED cells LC1a and LC1c may be disposed in a first diagonal direction, and the two second lower LED cells LC1b may be disposed in a second diagonal direction. As described above, the width of the cell isolation space ISO may have a width smaller than that of the first bonding electrode 135a. Accordingly, the first bonding electrode 135a may overlap and may be electrically connected to the corner regions of the first to third lower LED cells LC1a, LC1b, and LC1c. In the example embodiment, the width of the cell isolation space ISO may decrease downwardly, and the first to third lower LED cells LC1a, LC1b, and LC may have inclined side surfaces.

A through hole TH for the second individual electrode (150b in FIG. 9C) may be formed through the second etching process. The through hole TH may penetrate through a portion of the first and second bonding insulating layers 131a and 131b and the second semiconductor laminate SL2 from the second lower LED cell LC1b and may be connected up to the first conductive semiconductor layer 142 of the second semiconductor laminate SL2. The second semiconductor laminate SL2 region in which the through hole TH is extended may be provided as an upper LED cell LC2 in a subsequent process. In the example embodiment, when configuring the Bayer pattern, as illustrated in FIG. 10A, through holes may be formed in the second lower LED cells LC2 disposed in the second diagonal direction, respectively.

Each of the first and second etching processes may be performed through a selective etching process using a photoresist pattern, and the order is not limited. For example, the second etching process and the first etching process may be performed in order, and after forming the through hole to the same depth in the first etching process, the second etching process may be performed to etch an additional depth.

Thereafter, referring to FIGS. 9B and 10B, a base insulating layer 110 may be formed on the first to third lower LED cells LC1a, LC1b, and LC1c such that the cell isolation space ISO may be filled.

The base insulating layer 110 may include an inter-cell insulating portion 110E isolating the first to third lower LED cells LC1a, LC1b, and LC1c. The base insulating layer 110 may include at least one of SiO$_2$, SiN, SiCN, SiOC, SiON and SiOCN. In this process or in another process, a side wall insulating film 151 may be formed on a side wall of the through hole TH to be exposed on the bottom surface of the through hole TH.

In example embodiments, the base insulating layer 110 may be configured to include a reflective element. In this case, first, an insulating film may be relatively conformally formed. In this process, the side wall insulating film 151 may be formed together. Thereafter, a reflective layer may be formed in regions other than regions in which the first to third individual electrodes are to be formed. For example, the reflective layer may include a reflective metal such as Ag, Ni or Al. Thereafter, a base insulating layer 110 may be formed as a filling insulating portion. For example, the base insulating layer 110 may include silicon oxide or a silicon oxide-based insulating material. In example embodiments, the reflective layer may be implemented as a DBR layer or an omnidirectional reflector (ODR) layer. When a DBR layer is included as a reflective layer, the insulating film may not be provide.

Thereafter, referring to FIGS. 9C and 10C, first and third individual electrodes 150a and 150c connected to the first conductive semiconductor layers 122 of the first and third lower LED cells LC1a and LC1c, respectively, may be formed, and a second individual electrode 150b connected to the first conductive semiconductor layer 142 of the second semiconductor laminate SL2 may be formed by filling the through hole TH.

By forming openings for opening a portion of regions (a portion of regions of the first conductive semiconductor layer) of the first and third lower LED cells LC1a and LC in the base insulating layer, and forming a metal material filling the openings and the through holes TH, the first to third individual electrodes 150a, 150b, and 150c may be formed. For example, the first to third individual electrodes 150a, 150b, and 150c may include copper or a copper-containing alloy, and may be formed using a dual-damascene process.

FIGS. 11A, 11B, 11C and 11D are cross-sectional views illustrating a portion of processes (processes of bonding a circuit board and forming an upper light emitting structure) of a method of manufacturing an LED display apparatus according to an example embodiment.

Figure 11A:
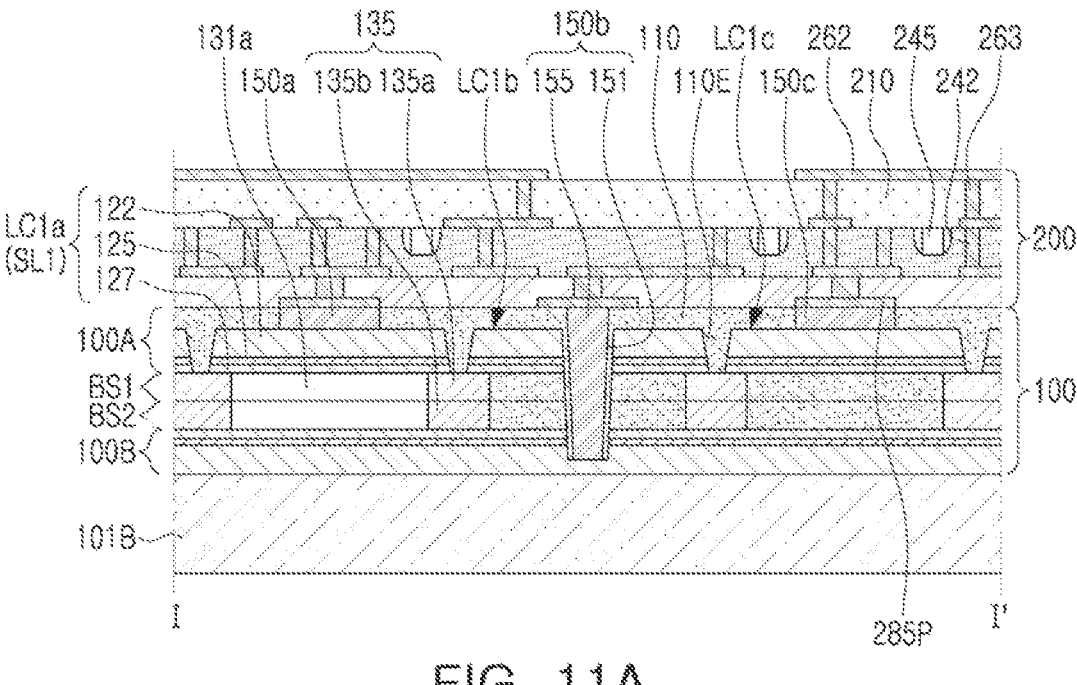
FIGS. 11A, 11B, 11C and 11D are cross-sectional views illustrating a portion of processes (processes of bonding a circuit board and forming an upper light emitting structure) of a method of manufacturing an LED display apparatus according to an example embodiment of the present disclosure.

Referring to FIG. 11A, a circuit board 200 may be bonded on the result (i.e., on the resulting structure) in FIG. 10C.

In the bonding process, the first to third individual electrodes 150a, 150b, and 150c of the lower light emitting structure 100A may be metal bonded to the driver circuit (the bonding pads 285P). Also, surfaces of the dielectric layer 281 and the base insulating layer 110 opposing each other may have coplanar surfaces and may be bonded between dielectrics. Also, the pixel array 100 may include a via electrode connected to the common electrode 135 on a periphery thereof, and the via electrodes may be bonded to the bonding pad 285P similarly to other individual electrodes 150a, 150b, and 150c.

Figure 12:
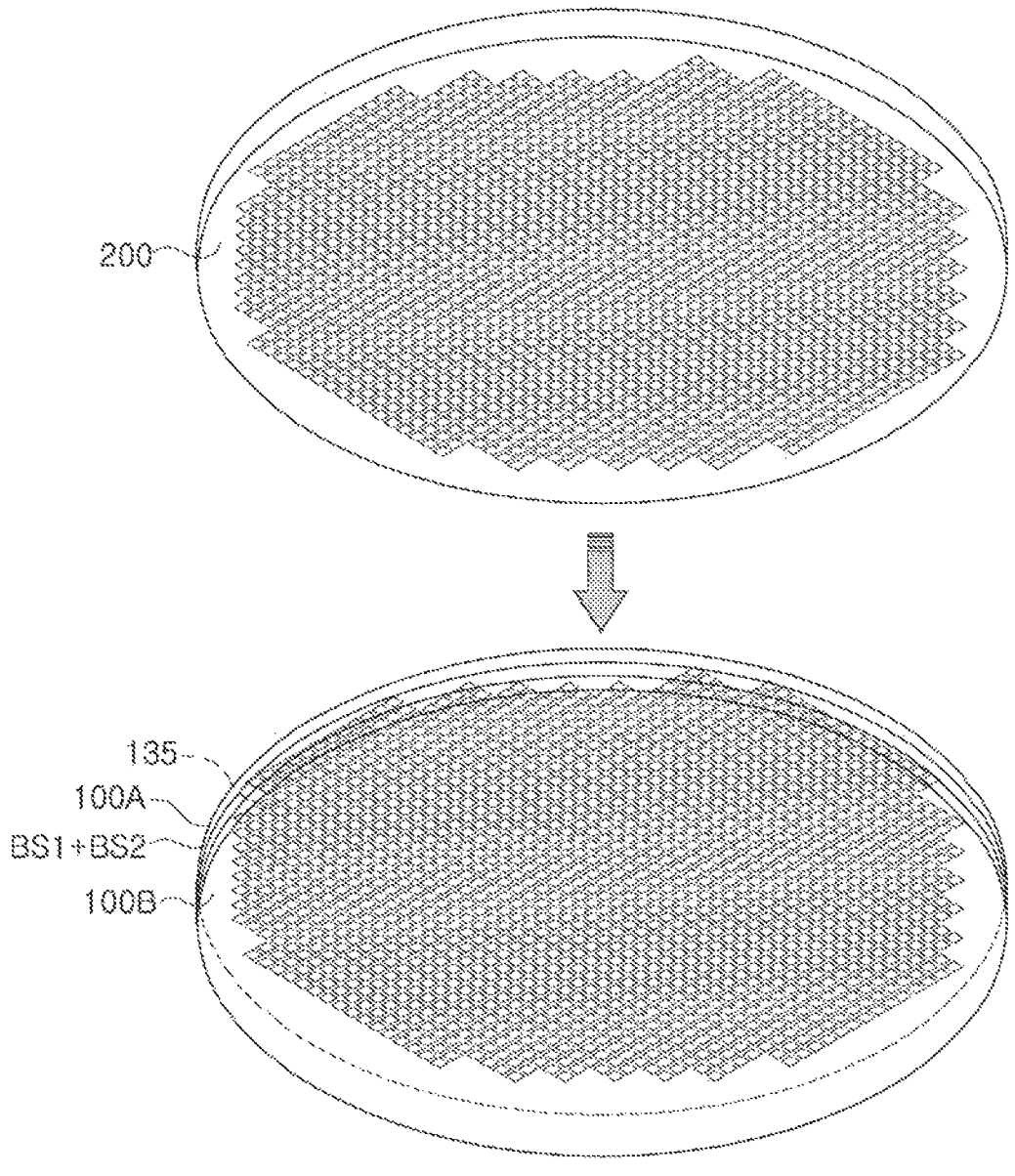
FIG. 12 is a diagram illustrating a process of bonding a circuit board in FIG. 11A according to an example embodiment.

FIG. 12 illustrates a process of bonding a circuit board in FIG. 11A according to an example embodiment. As illustrated in FIG. 12, a bonding process between the circuit board 200 and the pixel array 100 may be performed on a wafer level.

Figure 11B:
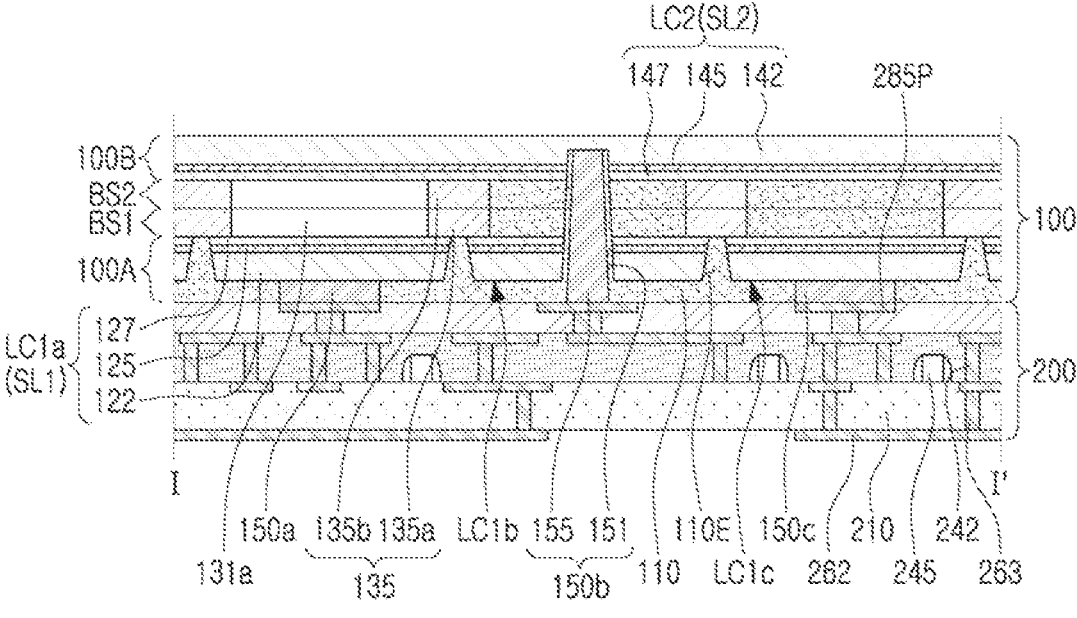

Thereafter, referring to FIG. 11B, the second growth substrate 101B may be removed from the second semiconductor laminate SL2.

Figure 11C:
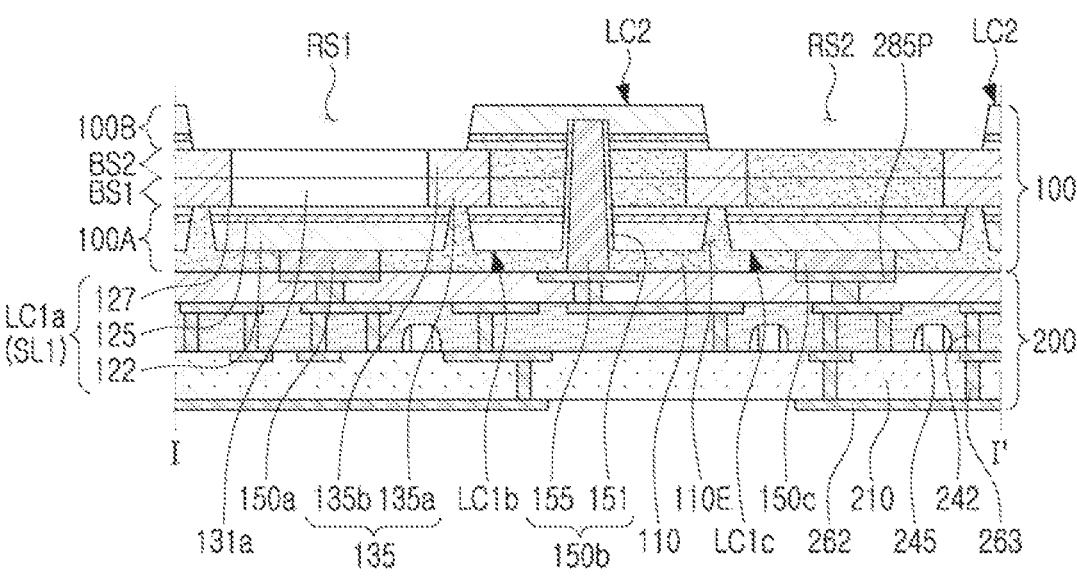
Figure 13:
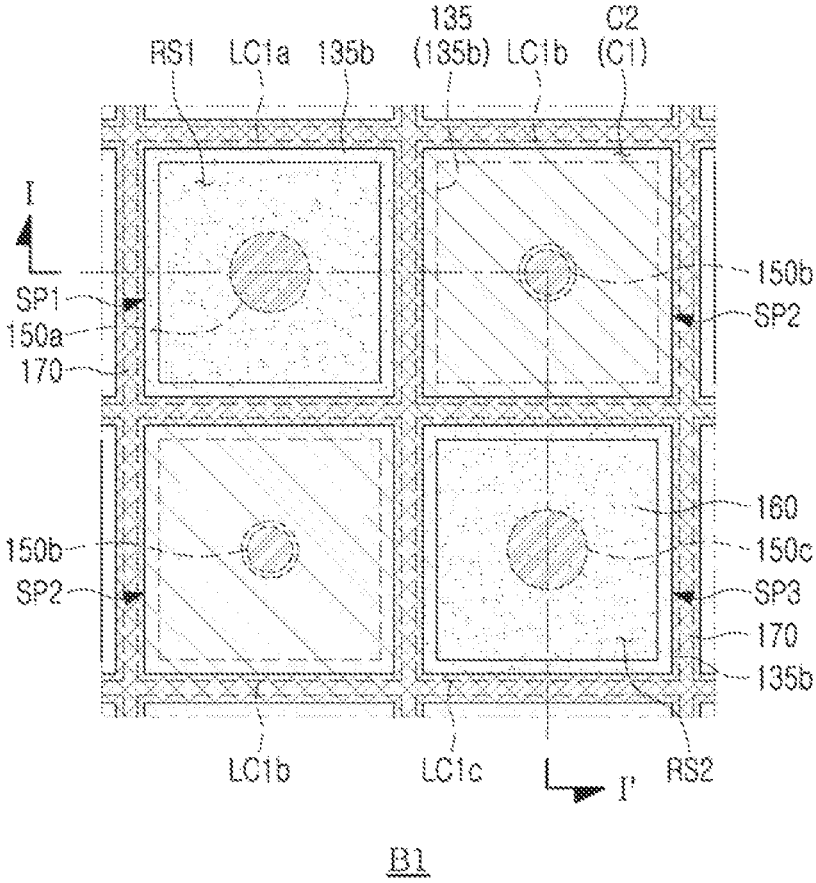
FIG. 13 is a diagram illustrating a result of FIG. 12 according to an example embodiment.

FIG. 13 illustrates a result of the process of FIG. 12 according to an example embodiment. Referring to FIGS. 11C and 13, and first and second recesses RS1 and RS2 may be formed by removing a portion of regions of the second semiconductor laminate SL2 to expose the first and third lower LED cells LC1a and LC1c corresponding to the first and third sub-pixels, respectively.

The second growth substrate 101B may be removed using a process similar to a process of removing the first growth substrate 101A (e.g., a laser lift-off or polishing process). The forming the first and second recesses RS1 and RS2 may be performed by an etching process using a photoresist pattern, similarly to the previous process of dividing the first semiconductor laminate SL1.

The first and third lower LED cells LC1a and LC may be exposed through the first and second recesses RS1 and RS2. In a plan view, as illustrated in FIG. 13, a portion of regions of the second bonding electrode 135b may be exposed around the first and second recesses RS1 and RS2, and in the regions overlapping the regions, the first bonding electrode 135a may be connected to the corner region C1 of the first and third lower LED cells LC1a and LC1c. Also, the corner region C2 of the remaining upper LED cells LC2 may be electrically connected to the second bonding electrode 135b.

Figure 11D:
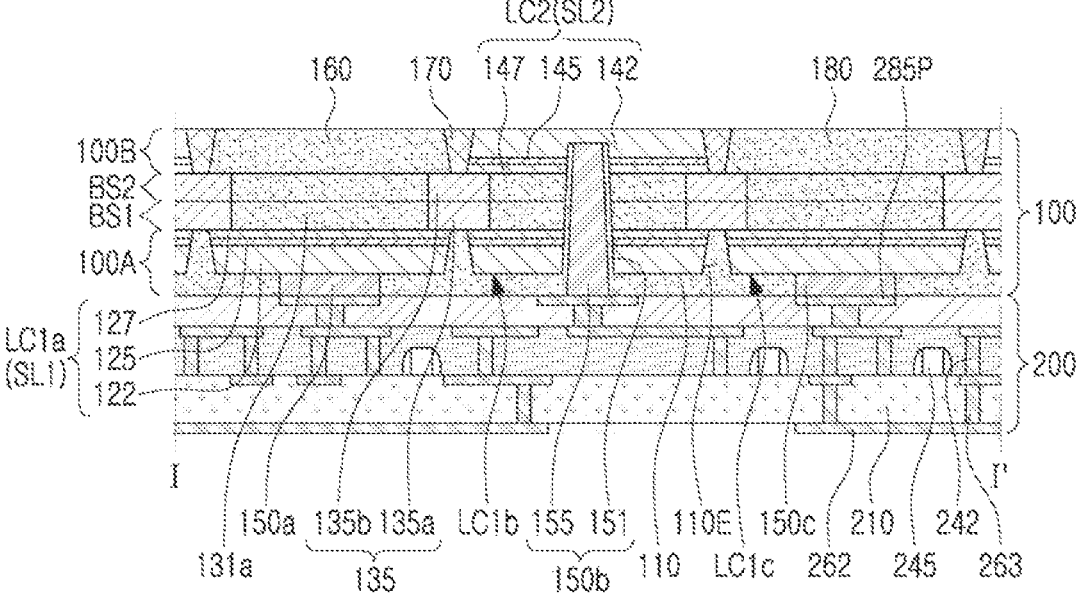

Thereafter, referring to FIG. 11D, a transparent insulating portion 160 and a wavelength converter 180 may be formed in the first and second recesses RS1 and RS2, respectively, and a light blocking partition 170 may be formed.

A transparent insulating portion 160 may be formed in the first recess RS1 for the first sub-pixel SP1, and a wavelength converter in the second recess RS2 for the third sub-pixel SP3 180 may be formed. For example, the transparent insulating portion 160 may be formed of a transparent resin such as a silicone resin or an epoxy resin, or a silicon oxide such as SiO$_2$. The wavelength converter 180 may include a transparent resin mixed with a wavelength conversion material converting light of a first wavelength (e.g., blue light) into light of a third wavelength (e.g., red light).

In the upper light emitting structure 100B, the sub-pixel isolation region, (i.e., the region among the transparent insulating portion 160, the upper LED cell LC2, and the wavelength converter 180) may be opened, and a light blocking partition 170 may be formed by filling a light blocking material. The light blocking partition 170 may have a grid structure formed to overlap the common electrode 135 in a vertical direction.

In the example embodiment, in the first sub-pixel SP1, blue light generated by the first lower LED cell LC1a may be emitted as is through the first and second bonding insulating layers 131a and 131b and the transparent insulating portion 160, and in the third sub-pixel SP3, the blue light generated by the third lower LED cell LC1c may pass through the first and second bonding insulating layers 131a and 131b, may be converted into red light through the wavelength converter 192 and red light may be emitted. In the second sub-pixel SP2, green light may be emitted from the upper LED cell LC2. During the driving process, the second lower LED cell LC2c may be an inactive LED cell and may not emit light.

Figure 14:
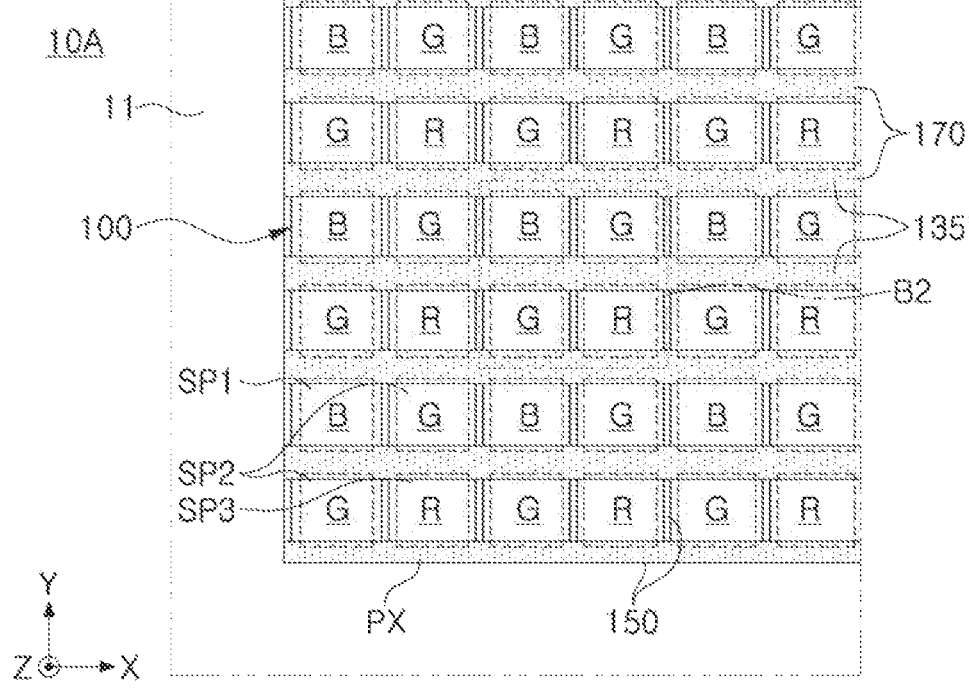
FIG. 14 is a plan view illustrating a portion of a display apparatus according to an example embodiment of the present disclosure.
Figure 15:
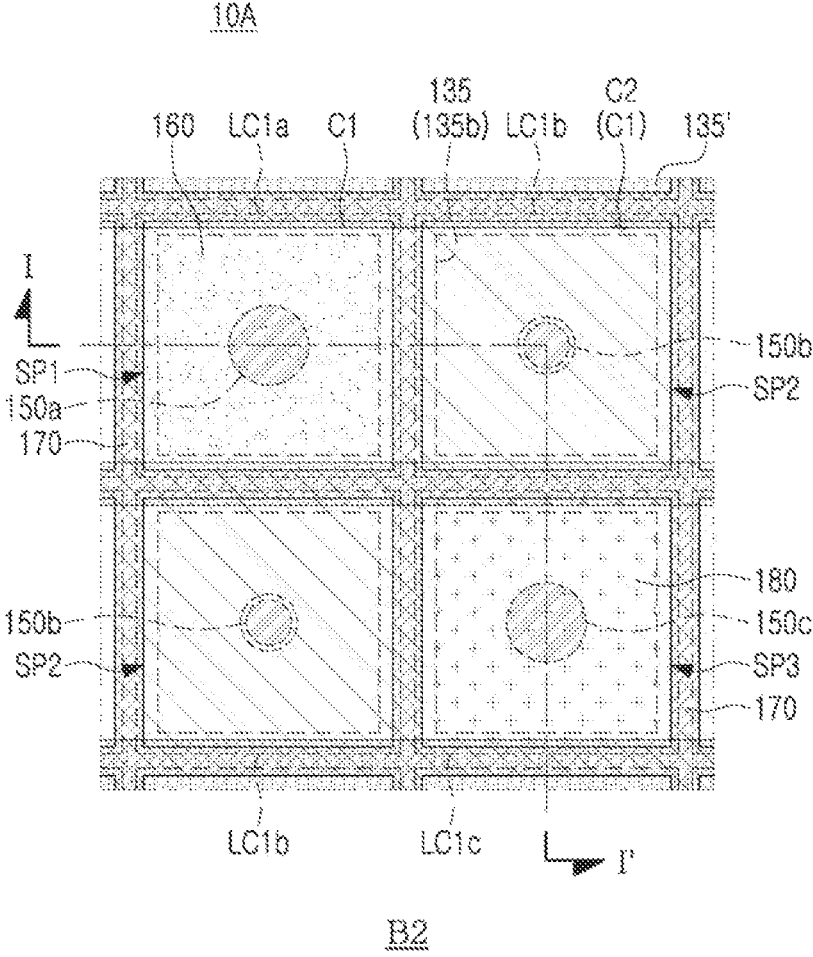
FIG. 15 is a plan view illustrating a pixel unit employed in the display apparatus in FIG. 14 according to an example embodiment.

FIG. 14 is a plan view illustrating a portion of a display apparatus according to an example embodiment. FIG. 15 is a plan view illustrating a pixel unit employed in the display apparatus in FIG. 14 according to an example embodiment.

Referring to FIGS. 14 and 15, the LED display apparatus 10A according to the example embodiment may include features similar to the features of the LED display apparatus 10 illustrated in FIGS. 1 to 4, except that the configuration in which a common electrode 135' bonded to the first and second bonding electrodes may extend along the adjacent sub-pixels SP1, SP2, and SP3 in the column direction. The components in the example embodiment may be understood with reference to the descriptions of the same or similar components of the LED display apparatus 10 illustrated in FIGS. 1 to 4 unless otherwise indicated, and repeated descriptions may be omitted.

The common electrode 135 in the example embodiment may not have a grid shape, but may have a plurality of line shapes connected to light sources of adjacent sub-pixels SP1, SP2, and SP3 in a column direction. A plurality of line shapes may be integrally connected around the pixel array 100. The common electrode 135 in the example embodiment may be configured to be connected to light sources opposing each other in a column direction. In example embodiments, the common electrode may be connected only to sub-pixel LED cells arranged in a row. The common electrode may selectively drive sub-pixels (G1, G2, . . . Gn in FIG. 5) disposed in each column. The connection of the sub-pixels of the common electrode with the light source may be implemented in various manners.

Figure 16:
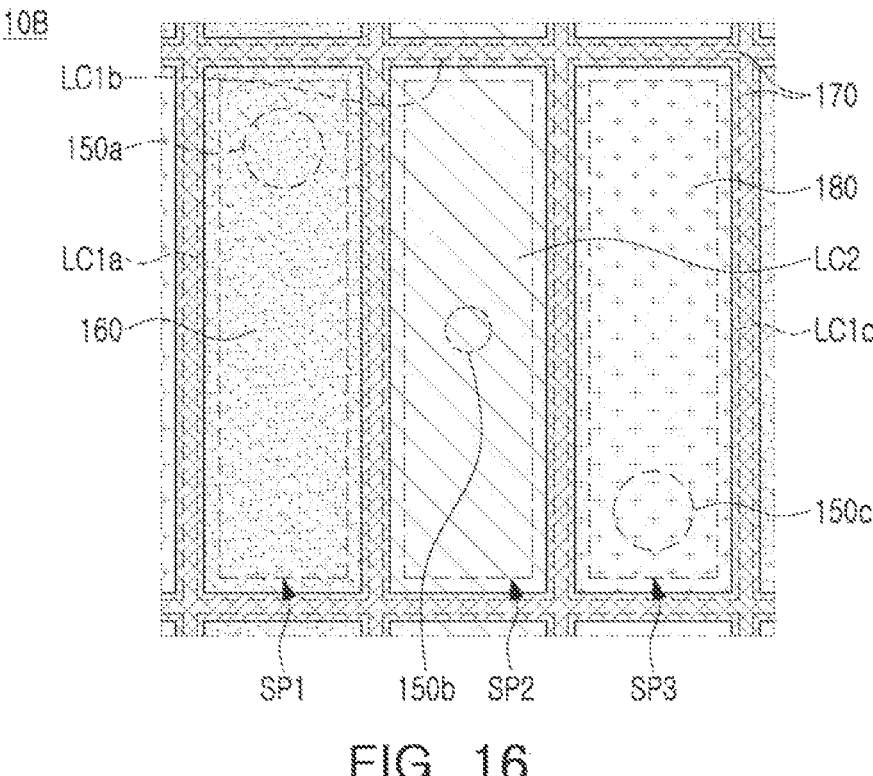
FIG. 16 is a plan view illustrating a pixel unit employed in a display apparatus according to an example embodiment of the present disclosure.

FIG. 16 is a plan view illustrating a pixel unit employed in a display apparatus according to an example embodiment.

Referring to FIG. 16, the display panel 10B according to the example embodiment may include similar features as those in the LED display apparatus 10 illustrated in FIGS. 1 to 4, except that the display panel 10B may include three sub-pixels SP1, SP2, and SP3 for each pixel. Components in the example embodiment may be understood with reference to descriptions of the same or similar elements of the LED display apparatus 10 illustrated in FIGS. 1 to 4 unless otherwise indicated, and repeated descriptions may be omitted.

Each of the plurality of pixels may include a first sub-pixel SP1, a second sub-pixel SP2, and a third sub-pixel SP3 disposed side by side in the horizontal direction. Each of the first sub-pixel SP1, the second sub-pixel SP2, and the third sub-pixel SP3 may have the same rectangular shape.

Similarly to the previous example embodiment, the first sub-pixel SP1 may be configured to emit blue light generated by the first lower LED cell LC1a from the transparent insulating portion 160, and the third sub-pixel SP3 may be configured to convert at least a portion of blue light generated by the third lower LED cell LC1c into red light through the wavelength converter 180 and to emit red light. The second sub-pixel SP2 may be configured to emit green light generated by the upper LED cell LC2, and the second lower LED cell LC1c disposed therebelow may be configured as an inactive cell which is not driven.

In particular, the lower light emitting structure 100A and the upper light emitting structure 100B may form a pixel array 100 by bonding of the first and second bonding structures BS1 and BS2. The first bonding electrode and the second bonding electrode may be bonded and may provide a common electrode.

Figure 17:
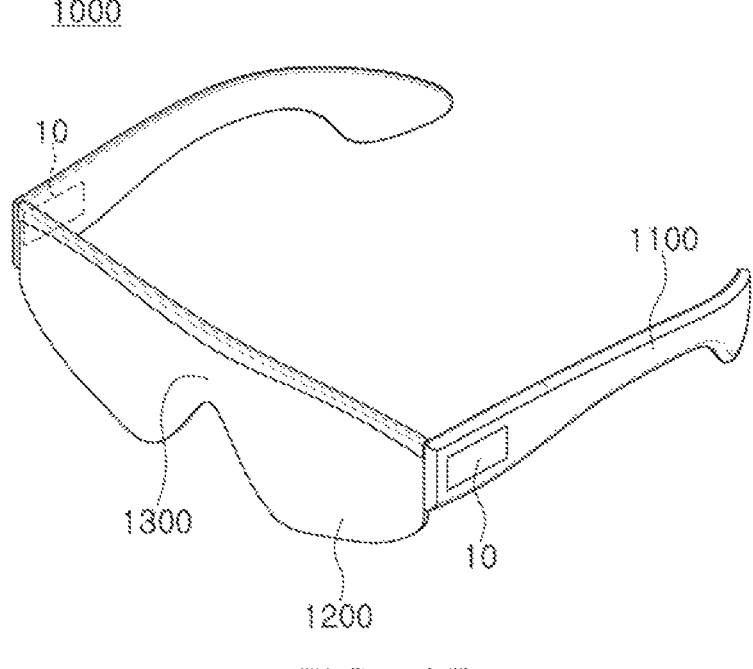
FIG. 17 illustrates an electronic device including a display apparatus according to an example embodiment of the present disclosure.

FIG. 17 illustrates an electronic device including a display apparatus according to an example embodiment.

Referring to FIG. 17, an electronic device 1000 according to the example embodiment may be a glasses-type display which is a wearable device. The electronic device 1000 may include a pair of temples 1100, a pair of light coupling lenses 1200, and a bridge 1300. The electronic device 1000 may further include a display apparatus 10 including an image generator.

The electronic device 1000 may be implemented as a head-mounted, glasses-type, or goggles-type virtual reality (VR) device for providing virtual reality or providing virtual images and external real scenery together, an augmented reality (AR) device, or a mixed reality (MR) device.

The temples 1100 may extend in one direction. The temples 1100 may be spaced apart from each other and may extend in parallel. The temples 1100 may be folded toward the bridge 1300. The bridge 1300 may be provided between the light coupling lenses 1200 and may connect the light coupling lenses 1200 to each other. The light coupling lenses 1200 may include a light guide plate. The display apparatus 10 may be disposed on each of the temples 1100 and may generate an image on the light coupling lenses 1200. The display apparatus 10 may be implemented as a display apparatus according to the aforementioned example embodiments.

According to the aforementioned example embodiments, an LED display apparatus having high efficiency which may easily couple light sources for sub-pixels to a driving substrate through a bonding process on a wafer level is provided.

Each of the embodiments provided in the above description is not excluded from being associated with one or more features of another example or another embodiment also provided herein or not provided herein but consistent with the disclosure.

While the disclosure has been particularly shown and described with reference to embodiments thereof, it will be understood that various changes in form and details may be made therein without departing from the spirit and scope of the following claims.

What is claimed is:
1. A display apparatus, comprising:
a circuit board comprising a driver circuit; and
a pixel array comprising a plurality of pixels on the circuit board, wherein each of the plurality of pixels comprises a first sub-pixel, a second sub-pixel, and a third sub-pixel,
wherein the pixel array further comprises:
    a lower light emitting structure comprising:
        a first lower light-emitting diode (LED) cell, a second lower LED cell, and a third lower LED cell respectively corresponding to the first sub-pixel, the second sub-pixel, and the third sub-pixel, each of the first lower LED cell, the second lower LED cell, and the third lower LED cell comprising a first semiconductor laminate configured to emit first light of a first wavelength, and
        a base insulating layer on lower surfaces of the first lower LED cell, the second lower LED cell, and the third lower LED cell and comprising an inter-cell insulating portion extending to a region between the first lower LED cell, the second lower LED cell, and the third lower LED cell;
    an upper light emitting structure on the lower light emitting structure, the upper light emitting structure comprising:
        a transparent insulating portion on the first lower LED cell,
        an upper LED cell on the second lower LED cell and comprising a second semiconductor laminate configured to emit second light of a second wavelength,
        a wavelength converter on the third lower LED cell and configured to convert the first light into third light of a third wavelength, and
        a light blocking partition disposed among the transparent insulating portion, the upper LED cell, and the wavelength converter, the light blocking partition optically isolating the transparent insulating portion, the upper LED cell, and the wavelength converter from each other;
    a first bonding structure comprising:
        a first bonding insulating layer on an upper surface of the lower light emitting structure, and
        a first bonding electrode at least partially surrounded by the first bonding insulating layer and connected to each of the first lower LED cell, the second lower LED cell, and the third lower LED cell; and
    a second bonding structure comprising:
        a second bonding insulating layer on a lower surface of the upper light emitting structure and bonded to the first bonding insulating layer, and
        a second bonding electrode at least partially surrounded by the second bonding insulating layer, connected to at least the upper LED cell, and bonded to the first bonding electrode.
2. The display apparatus of claim 1, wherein each of the first semiconductor laminate and the second semiconductor laminate comprises a first conductive semiconductor layer, an active layer and a second conductive semiconductor layer, and
    wherein the lower light emitting structure and the upper light emitting structure are arranged such that the second conductive semiconductor layers of the first semiconductor laminate and the second semiconductor laminate face each other.

3. The display apparatus of claim 2, wherein the first bonding electrode and the second bonding electrode are respectively connected to the second conductive semiconductor layers of the first semiconductor laminate and the second semiconductor laminate.

4. The display apparatus of claim 2, wherein the pixel array further comprises:

a first individual electrode on a lower surface of the first lower LED cell and connected to the first conductive semiconductor layer of the first lower LED cell;

a second individual electrode penetrating a portion of the second lower LED cell, the first bonding insulating layer, the second bonding insulating layer, and the upper LED cell, and connected to the first conductive semiconductor layer of the upper LED cell; and a third individual electrode on a lower surface of the third lower LED cell and connected to the first conductive semiconductor layer of the third lower LED cell.

5. The display apparatus of claim 4, wherein the second individual electrode comprises:

a through via extending from a lower surface of the second lower LED cell to the second conductive semiconductor layer of the upper LED cell; and a side wall insulating film at least partially surrounding a side surface of the through via.

6. The display apparatus of claim 1, wherein the first bonding electrode and the second bonding electrode comprise shapes corresponding to each other in a plan view.

7. The display apparatus of claim 6, wherein the first bonding electrode and the second bonding electrode comprise a grid shape in a plan view.

8. The display apparatus of claim 6, wherein the first bonding electrode and the second bonding electrode comprise a plurality of line shapes in a plan view.

9. The display apparatus of claim 1, wherein the first bonding electrode comprises an upper surface substantially coplanar with an upper surface of the first bonding insulating layer, and wherein the second bonding electrode comprises a lower surface substantially coplanar with a lower surface of the second bonding insulating layer.

10. The display apparatus of claim 1, wherein each of the first bonding insulating layer and the second bonding insulating layer comprise a transparent insulating material.

11. The display apparatus of claim 1, wherein the first bonding electrode comprises a grid shape in a plan view, and wherein the inter-cell insulating portion at least partially overlaps the first bonding electrode in a direction substantially perpendicular to an upper surface of the circuit board.

12. The display apparatus of claim 1, wherein the base insulating layer comprises at least one of $SiO_2$, SiN, SiCN, SiOC, SiON and SiOCN.

13. The display apparatus of claim 1, wherein each of the first lower LED cell, the second lower LED cell, and the third lower LED cell comprises a side surface that is inclined such that a width of each of the first lower LED cell, the second lower LED cell, and the third lower LED cell increases approaching the upper light emitting structure, and wherein the upper LED cell comprises a side surface that is inclined such that a width of the upper LED cell increases approaching the lower light emitting structure.

14. The display apparatus of claim 1, wherein the light blocking partition at least partially overlaps the second bonding electrode in a direction substantially perpendicular to an upper surface of the circuit board.

15. The display apparatus of claim 1, wherein the first semiconductor laminate is configured to emit blue light, wherein the second semiconductor laminate is configured to emit green light, and wherein the wavelength converter is configured to convert at least a portion of blue light to red light.

16. The display apparatus of claim 1, wherein the first sub-pixel and the third sub-pixel are disposed in a first diagonal direction and the second sub-pixel is disposed in a second diagonal direction in a plan view.

17. The display apparatus of claim 1, wherein the first sub-pixel, the second sub-pixel, and the third sub-pixel are disposed side by side in one direction in a plan view.

18. A display apparatus, comprising:

a circuit board comprising a driver circuit; and a pixel array on the circuit board and comprising a plurality of pixels, wherein each of the plurality of pixels comprises a first sub-pixel, a second sub-pixel, and a third sub-pixel, wherein the pixel array further comprises:

a lower light emitting structure comprising a first lower light-emitting diode (LED) cell, a second lower LED cell, and a third lower LED cell respectively corresponding to the first sub-pixel, the second sub-pixel, and the third sub-pixel and configured to emit blue light, an upper light emitting structure comprising:

a transparent insulating portion on the first lower LED cell, an upper LED cell on the second lower LED cell and configured to emit green light, and a wavelength converter on the third lower LED cell and configured to convert blue light into red light, a first bonding structure comprising:

a first bonding insulating layer on an upper surface of the lower light emitting structure, and a first bonding electrode at least partially surrounded by the first bonding insulating layer and connected to each of the first lower LED cell, the second lower LED cell, and the third lower LED cell, and a second bonding structure comprising:

a second bonding insulating layer on a lower surface of the upper light emitting structure and bonded to the first bonding insulating layer, and a second bonding electrode at least partially surrounded by the second bonding insulating layer, connected to the upper LED cell, and bonded to the first bonding electrode.

19. The display apparatus of claim 18, wherein the first bonding electrode comprises a grid shape connected to each of the first lower LED cell, the second lower LED cell, and the third lower LED cell along a boundary of the first lower LED cell, the second lower LED cell, and the third lower LED cell.

20. The display apparatus of claim 19, wherein the second bonding electrode comprises a grid shape corresponding to a shape of the first bonding electrode.

21. The display apparatus of claim 20, wherein the upper light emitting structure comprises a light blocking partition disposed among the transparent insulating portion, the upper LED cell, and the wavelength converter, and optically isolating the transparent insulating portion, the upper LED cell, and the wavelength converter from each other, and wherein the light blocking partition comprises a grid structure at least partially overlapping the second bonding electrode in a direction substantially perpendicular to an upper surface of the circuit board.

22. The display apparatus of claim 18, wherein the second lower LED cell is provided as an inactive LED cell which is not driven.

23. A display apparatus, comprising:

a circuit board comprising a driver circuit; and a pixel array comprising a plurality of pixels on an upper surface of the circuit board, each of the plurality of pixels comprising a first sub-pixel, a second sub-pixel, and a third sub-pixel, wherein the pixel array further comprises:

a lower light emitting structure comprising a first lower light-emitting diode (LED) cell, a second lower LED cell, and a third lower LED cell each comprising a first semiconductor laminate configured to emit blue light;

an upper light emitting structure on the lower light emitting structure, the upper light emitting structure comprising:

a transparent insulating portion on the first lower LED cell, an upper LED cell on the second lower LED cell and comprising a second semiconductor laminate configured to generate green light, and a wavelength converter on the third lower LED cell and configured to convert blue light into red light;

a first bonding structure comprising:

a first bonding insulating layer on an upper surface of the lower light emitting structure, and a first bonding electrode at least partially surrounded by the first bonding insulating layer and connected to each of the first lower LED cell, the second lower LED cell, and the third lower LED cell; and a second bonding structure on a lower surface of the upper light emitting structure, the second bonding structure comprising:

a second bonding insulating layer bonded to the first bonding insulating layer, and a second bonding electrode at least partially surrounded by the second bonding insulating layer, connected to the upper LED cell, and bonded to the first bonding electrode, wherein the first sub-pixel is configured to emit blue light generated by the first lower LED cell from the transparent insulating portion, wherein the second sub-pixel is configured to emit green light generated by the upper LED cell, the second lower LED cell being provided as an inactive cell which is not driven, and wherein the third sub-pixel is configured to convert at least a portion of blue light generated by the third lower LED cell into red light through the wavelength converter, and emit red light.

24. The display apparatus of claim 23, wherein each of the first semiconductor laminate and the second semiconductor laminate comprises a conductive semiconductor layer, an active layer and a second conductive semiconductor layer, wherein the second conductive semiconductor layer of the second semiconductor laminate opposes the second conductive semiconductor layer of the first semiconductor laminate, and wherein the first bonding electrode and the second bonding electrode are connected to the second conductive semiconductor layer of each of the first semiconductor laminate and the second semiconductor laminate.

25. The display apparatus of claim 24, wherein the pixel array further comprises:

a first individual electrode on a lower surface of the first lower LED cell and connected to a conductive semiconductor layer of the first lower LED cell;

a second individual electrode penetrating a portion of the second lower LED cell, the first bonding insulating layer, the second bonding insulating layer, and the upper LED cell, and connected to a conductive semiconductor layer of the upper LED cell; and a third individual electrode on a lower surface of the third lower LED cell and connected to a conductive semiconductor layer of the third lower LED cell.

* * * * *